(12) United States Patent
Ashida et al.

(10) Patent No.: US 7,382,643 B2
(45) Date of Patent: Jun. 3, 2008

(54) MAGNETORESISTIVE EFFECT ELEMENT AND MAGNETIC MEMORY DEVICE

(75) Inventors: Hiroshi Ashida, Kawasaki (JP); Masashige Sato, Kawasaki (JP); Shinjiro Umehara, Kawasaki (JP); Kazuo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 11/338,889

(22) Filed: Jan. 25, 2006

(65) Prior Publication Data

US 2007/0076469 A1 Apr. 5, 2007

(30) Foreign Application Priority Data

Sep. 16, 2005 (JP) ............................. 2005-269896

(51) Int. Cl.
*G11C 11/00* (2006.01)
(52) U.S. Cl. ........................ 365/158; 365/171; 365/173
(58) Field of Classification Search ................ 365/158, 365/171, 173; 257/421
See application file for complete search history.

(56) References Cited

U.S. PATENT DOCUMENTS

| 6,838,740 | B2* | 1/2005 | Huai et al. ................. 257/421 |
| 6,956,764 | B2* | 10/2005 | Engel et al. ................ 365/158 |
| 7,035,058 | B2* | 4/2006 | Hosomi .................... 360/324.1 |
| 2007/0096229 | A1* | 5/2007 | Yoshikawa et al. ......... 257/421 |

FOREIGN PATENT DOCUMENTS

| JP | 11-317071 | 11/1999 |
| JP | 2002-359412 | 12/2002 |
| JP | 2004-158766 | 6/2004 |

OTHER PUBLICATIONS

Kohjiro Yagami et al., "Research Trend in Spin Transfer Magnetization Switching", Journal of the Magnetics Society of Japan, vol. 28, No. 9, 2004, pp. 937-948.
G.D. Fuchs, "Spin-transfer effects in nanoscale magnetic tunnel junctions", Applied Physics letters, vol. 85, No. 7, 2004, pp. 1205-1207.

* cited by examiner

*Primary Examiner*—Richard T. Elms
*Assistant Examiner*—Alexander Sofocleous
(74) *Attorney, Agent, or Firm*—Westerman, Hattori, Daniels & Adrian, LLP.

(57) ABSTRACT

The magnetoresistive effect element comprises a pinned magnetic layer 16 having a multilayered synthetic antiferromagnet (SAF) structure, a nonmagnetic spacer layer 18 formed on the pinned magnetic layer 16, a free magnetic layer 20 formed on the nonmagnetic spacer layer 18 and formed of a single ferromagnetic layer, a nonmagnetic spacer layer 22 formed on the free magnetic layer 20, and a pinned magnetic layer 24 of a multilayered SAF structure formed on the nonmagnetic spacer layer 22, wherein a magnetization direction of the ferromagnetic layer 16c of the pinned magnetic layer 16, which is nearest the free magnetic layer 20, and a magnetization direction of the ferromagnetic layer 24a of the pinned magnetic layer 24, which is nearest the free magnetic layer 20, are opposite to each other.

12 Claims, 16 Drawing Sheets

MAGNETORESISTIVE EFFECT ELEMENT AND MAGNETIC MEMORY DEVICE

CROSS-REFERENCE TO RELATED APPLICATIONS

This application is based upon and claims the benefit of priority from the prior Japanese Patent Application No. 2005-269896, filed on Sep. 16, 2005, the entire contents of which are incorporated herein by reference.

BACKGROUND OF THE INVENTION

The present invention relates to a magnetoresistive effect element and a magnetic memory device, more specifically, a magnetoresistive effect element using spin transfer torque switching (spin transfer magnetization switching) mechanism, and a magnetic memory device using the magnetoresistive effect element.

Recently, as a rewritable non-volatile memory, a magnetic random access memory (hereinafter called an MRAM) including magnetoresistive effect elements arranged in a matrix is noted. The MRAM memorizes information by using combinations of magnetization directions of two magnetic layers and reads memorized information by detecting resistance changes (i.e., current changes or voltage changes) between when magnetization directions of the magnetic layers are parallel with each other and when magnetization directions of the magnetic layers are anti-parallel with each other.

As the magnetoresistive effect element forming the MRAM, a giant magnetoresistive (hereinafter called a GMR) element and a tunneling magnetoresistive (hereinafter called a TMR) element are being proposed. Among them, the TMR element which can have large resistance changes is noted as a magnetoresistive effect element to be used in the MRAM.

The TMR element includes two ferromagnetic layers laid one on another with a tunnel insulating film formed therebetween and utilizes the phenomena that the tunnel current flowing between the magnetic layers via the tunnel insulating film changes depending on relationships of magnetization directions of the two ferromagnetic layers. That is, the TMR element has low element resistance when the magnetization directions of the two ferromagnetic layers are parallel with each other and has high element resistance when the magnetization directions are anti-parallel with each other. These two states are related to data "0" and data "1" to thereby use the TMR element as a memory device.

The MRAM using the TMR element includes two signal lines (e.g., a bit line and a write word line) normally crossing each other, which are provided respectively above and below the TMR element (see, e.g., Japanese published unexamined patent application No. Hei 11-317071 (1999) (Patent Reference 1)). In reading data from the TMR element, a change of the element resistance is read to judge whether the data memorized in the TMR element is "0" or "1". On the other hand, generally in writing data into the TMR element, current is flowed in the signal lines, and a synthetic magnetic field of magnetic fields generated by the signal lines is applied to the TMR element, whereby the magnetization direction of one magnetic layer (free magnetic layer) is changed corresponding to the applied magnetic field (current magnetic field write method).

However, in the current magnetic field write method, the demagnetizing field of the free magnetic layer is increased as the size of the TMR element is reduced so as to satisfy larger capacities exceeding, e.g., gigabits (Gbits), and the magnetization reversing magnetic field $H_c$ of the free magnetic layer is accordingly increased. Accordingly, when the write current is small, defective write takes place. Thus, as the integration increases, the write current is increased, and electric power consumption is increased. Kohjiro Yagami et al., "Research Trend in Spin Transfer Magnetization Switching", Journal of the Magnetics Society of Japan, Vol. 28, No. 9, 2004, pp. 937-948 (Non-Patent Reference 1) anticipates that when the memory cell size is reduced to about 100 nm so as to satisfy large capacities exceeding gigabits, the conventional current magnetic filed write method drastically increases the write current, and actually the write will be difficult.

The MRAM with selective transistors connected to must include write word lines in addition to the bit lines and the word lines, which complicates the device structure and the fabrication process.

In such background, recently as the magnetoresistive effect element forming a large-capacity MRAM, the spin transfer torque switching (STS) element is noted (refer to, e.g., Non-Patent Reference 1). The spin transfer torque switching element is a magnetoresistive effect element including an insulation layer or a non-magnetic conductor layer between two ferromagnetic layers, as do the GMR element and TMR element.

In the spin transfer torque switching element, when current is flowed from the free magnetic layer to the pinned magnetic layer perpendicularly to the film surface, spin-polarized conduction electrons flow from the pinned magnetic layer to the free magnetic layer to make the exchange interaction with the electrons of the free magnetic layer. Resultantly, torques are generated between the electrons, and when the torques are sufficiently large, the magnetic moment of the free magnetic layer is switched from anti-parallel to parallel. On the other hand, when the current is applied oppositely, the conduction electrons flow from the free magnetic layer to the pinned magnetic layer. Parts of the conduction electrons are reflected against the interface between the nonmagnetic layer (insulation layer or nonmagnetic conduction layer) and the pinned magnetic layer, and the spins are switched. The conduction electrons reflected against the interface flow from the nonmagnetic layer again into the free magnetic layer and make the exchange interaction with the electrons of the free magnetic layer. Resultantly, torques are generated between the electrons, and when the torques are sufficiently large, the magnetic moment of the free magnetic layer is switched from parallel to anti-parallel. This switch from parallel to anti-parallel has poor spin transfer efficiency in comparison with the switch from anti-parallel to parallel and requires large current for the switch of the magnetization. As described above, the spin transfer torque switching element induces the magnetization switch of the free magnetic layer by the current control (application direction and application current value) alone to thereby rewrite the memory state.

The spin transfer torque switching element, which has the switching current decreased due to the volume decreasing effect even with the decrease of the element size and the resultant magnetization reversing magnetic field $H_c$, is much more advantageous to the elements of the current magnetic field write method in the capacity increase and electric power consumption decrease. The spin transfer torque switching element requires no write word lines, which permits the device structure and the fabrication process to be simplified. That is, the MRAM using the spin transfer torque switching elements can use the same device structure as DRAM, which permits the fabrication process to be simplified and the fabrication cost to be accordingly decreased.

However, to realize an MRAM of a large capacity exceeding gigabits, various problems, as of decreasing the write current, etc., are present. Non-Patent Reference 1 describes a cell area of ~(0.1 μm)$^2$, a RA (element resistance R×cell area A) of ~tens Ωμm$^2$, resistance change percentage above 30%, a write current (magnetization reversing current) $I_c$ below 0.1 mA, etc. tentatively calculated as the target values for realizing such large-capacity MRAM.

A 0.1 mA write current $I_c$ is equivalent to $1\times10^6$ A/cm$^2$ in the critical current density $J_c$. However, the critical current density $J_c$ so far reported on the research level is $0.5\times 10^7$~$10^7$ A/cm$^2$ (refer to Non-Patent References 1 and G. D. Fuchs, "Spin-transfer effects in nanoscale magnetic tunnel junctions", Applied Physics Letters, Vol. 85, No. 7, 2004, pp. 1205-1207 (Non-Patent Reference 2)). Accordingly, to realize a large-capacity MRAM, first, it is necessary to further decrease the write current.

As described above, in the conventional spin transfer torque switching element, the switch from parallel to anti-parallel depending on conduction electrons reflected against the interface between the ferromagnetic layer and the nonmagnetic layer is inefficient in comparison with the switch from anti-parallel to parallel and requires larger current. Accordingly, the resistance-current hysteresis characteristic of the spin transfer torque switching element has poor symmetry.

In the conventional spin transfer torque switching element, the free magnetic layer and the pinned magnetic layer are magnetically coupled due to leaking magnetic field from the pinned magnetic layer, and the resistance-current hysteresis characteristic has shifted.

In the large-capacity MRAM, to make the memory operation stable, high output changes are required. To this end, the spin transfer torque switching element is required to have large resistance change percentage.

The related arts are also disclosed in, e.g., Japanese published unexamined patent application No. 2004-158766 (Patent Reference 2) and Japanese published unexamined patent application No. 2002-359412 (Patent Reference 3).

SUMMARY OF THE INVENTION

An object of the present invention is to provide a magnetoresistive effect element using spin transfer torque switching mechanism which can decrease the magnetization reversing current, can realize the resistance-current hysteresis characteristic having good symmetry with the shift suppressed, and can realize large resistance changes, and a magnetic memory device using the magnetoresistive effect element.

According to one aspect of the present invention, there is provided a magnetoresistive effect element comprising: a first pinned magnetic layer having a multilayered synthetic antiferromagnet (SAF) structure formed of a plurality of ferromagnetic layers stacked with a nonmagnetic layer formed therebetween; a first nonmagnetic spacer layer formed on the first pinned magnetic layer; a free magnetic layer formed on the first nonmagnetic spacer layer and including an odd number of ferromagnetic layers; a second nonmagnetic spacer layer formed on the free magnetic layer; and a second pinned magnetic layer formed on the second nonmagnetic spacer layer and having a multilayered SAF structure formed of a plurality of ferromagnetic layers stacked with a nonmagnetic layer formed therebetween, a magnetization direction of the ferromagnetic layer of the first pinned magnetic layer, which is nearest the free magnetic layer, and a magnetization direction of the ferromagnetic layer of the second pinned magnetic layer, which is nearest the free magnetic layer, being opposite to each other.

According to another aspect of the present invention, there is provided a magnetoresistive effect element comprising: a first pinned magnetic layer having a multilayered SAF structure formed of a plurality of ferromagnetic layers stacked with a nonmagnetic layer formed therebetween; a first nonmagnetic spacer layer formed on the first pinned magnetic layer; a free magnetic layer formed on the first nonmagnetic spacer layer and including an even number of ferromagnetic layers; a second nonmagnetic spacer layer formed on the free magnetic layer; and a second pinned magnetic layer formed on the second nonmagnetic spacer layer and having a multilayered SAF structure formed of a plurality of ferromagnetic layers stacked with a nonmagnetic layer formed therebetween, a magnetization direction of the ferromagnetic layer of the first pinned magnetic layer, which is nearest the free magnetization, and a magnetization direction of the ferromagnetic layer of the second pinned magnetic layer, which is nearest the free magnetic layer, being the same.

According to the present invention, numbers of the ferromagnetic layers of the first and the second pinned magnetic layers having the multilayered SAF structure are suitably set in accordance with a number of the ferromagnetic layer of the free magnetic layer to orient in prescribed directions the magnetization directions of the ferromagnetic layers of the first and the second pinned magnetic layers, which are nearest the free magnetic layer, whereby the resistance change can be obtained independently of the magnetization reversing by the spin transfer using the reflected electrons, and the magnetization reversing current can be decreased, and resistance-current hysteresis characteristic of good symmetry can be obtained.

According to the present invention, in the dual pin structure including the first and the second pinned magnetic layers respectively formed on the underside and the upper side of the free magnetic layer, a resistance change of a first magnetoresistive effect unit formed of the free magnetic layer/the first nonmagnetic spacer/the first pinned magnetic layer, and a resistance change of a second magnetoresistive effect unit formed of the second pinned magnetic layer/the second nonmagnetic spacer layer/the free magnetic layer are different from each other, whereby the disadvantage that the resistance change of the magnetoresistive effect element as a whole is not generated or much decreased is prevented, and the magnetoresistive effect element as a whole can have large resistance change.

According to the present invention, the saturation magnetization and the thickness of the respective ferromagnetic layers forming the first and the second pinned magnetic layers of the multilayered SAF structure are suitably set, whereby the magnetic moment of the first and the second pinned magnetic layers is sufficiently decreased, whereby the magnetic coupling between the first and the second pinned magnetic layers, and the free magnetic layer can be suppressed. Accordingly, the shift of the resistance-current hysteresis characteristic can be sufficiently suppressed.

DETAILED DESCRIPTION OF THE INVENTION

[The Basic Structure of the Magnetoresistive Effect Element according to the Present Invention]

Before the specific structure of the magnetoresistive effect element according to the present invention is explained, the basic structure of the magnetoresistive effect element will be explained with reference to FIGS. 1 to 3.

Figure 1:
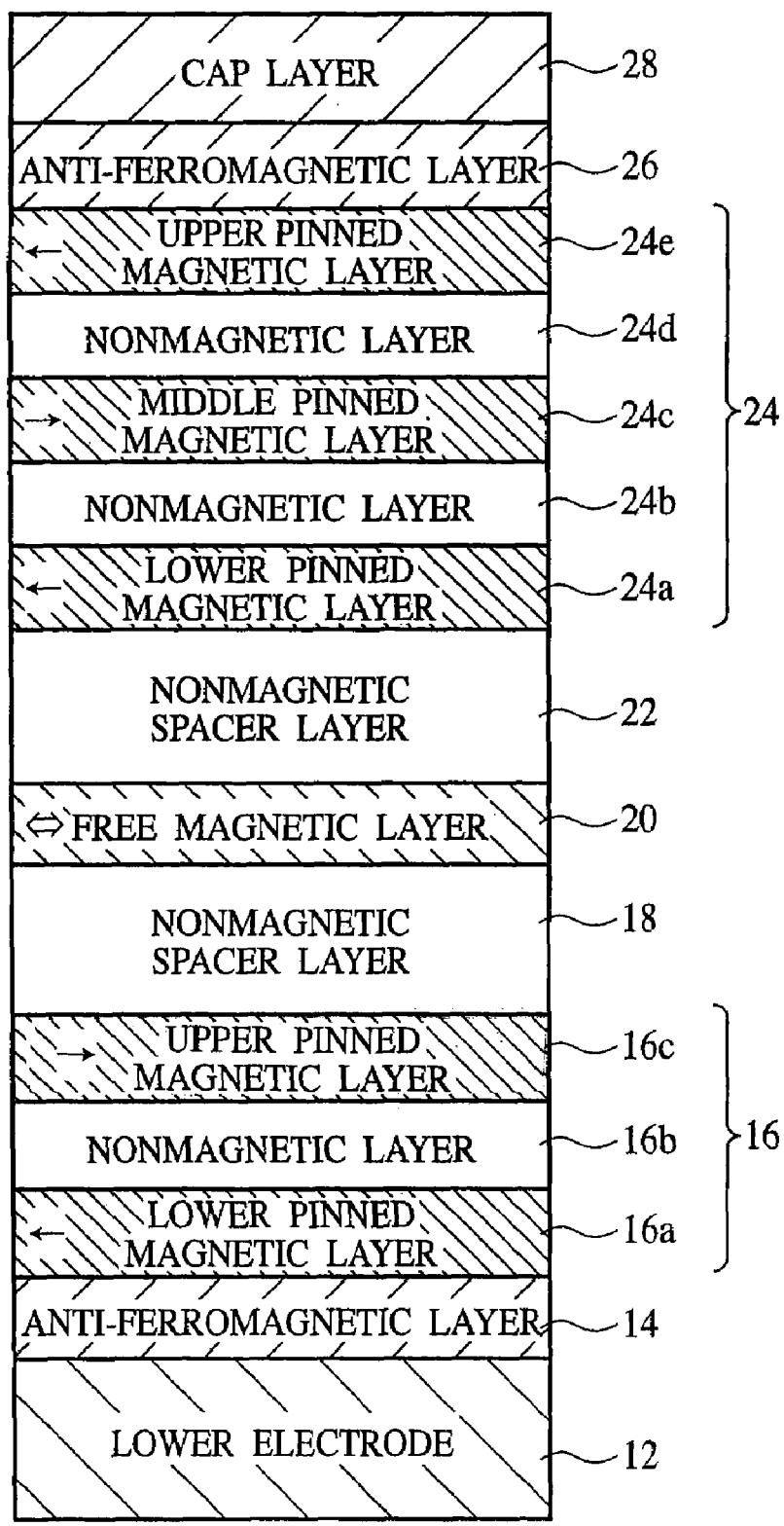
FIG. 1 is a diagrammatic view showing a basic multilayered structure of the magnetoresistive effect element according to the present invention (Part 1).
Figure 2:
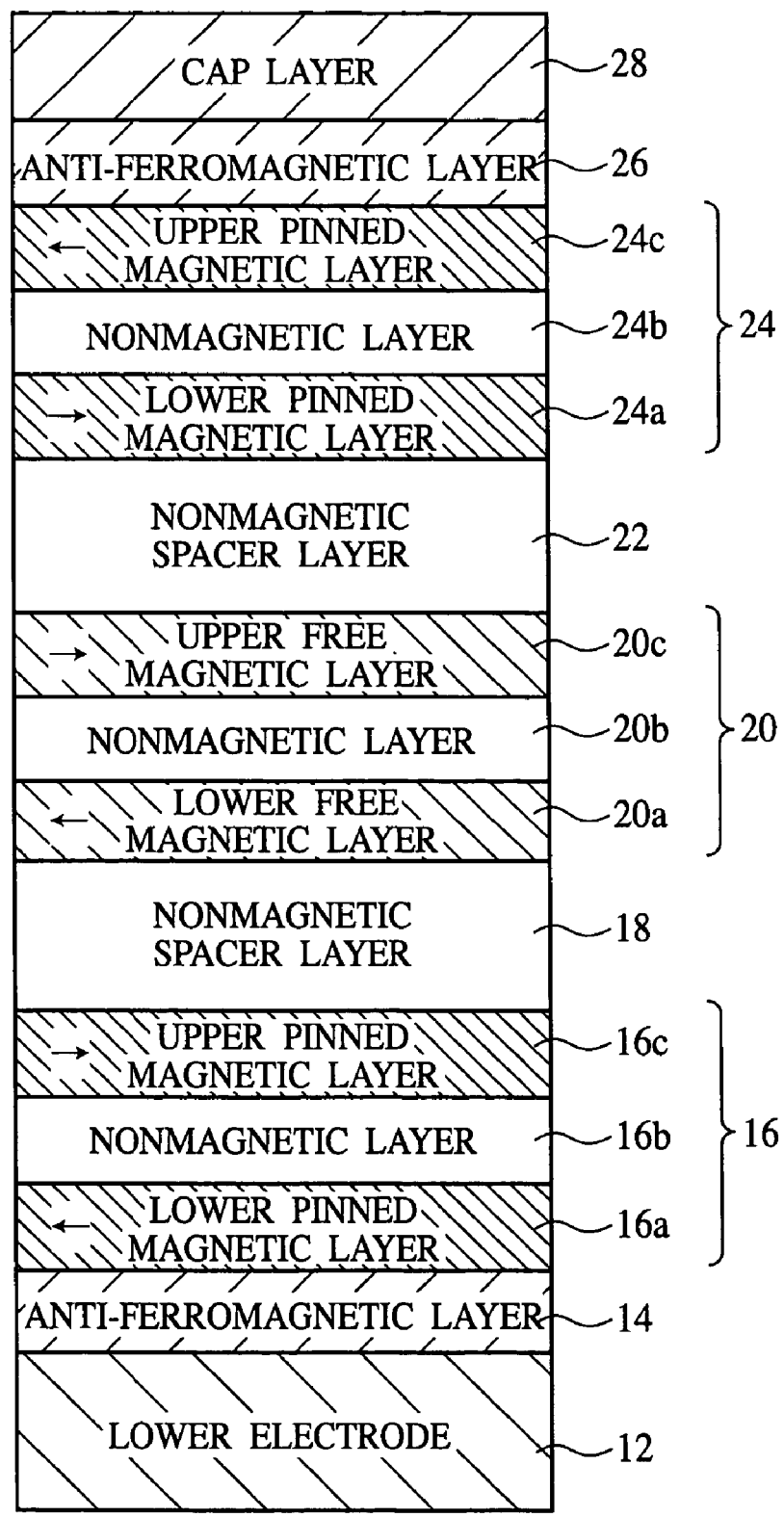
FIG. 2 is a diagrammatic view showing a basic multilayered structure of the magnetoresistive effect element according to the present invention (Part 2).

FIGS. 1 and 2 are diagrammatic views of the basic structure of the magnetoresistive effect element according to the present invention. FIG. 1 shows the multilayered structure including an odd number of ferromagnetic layers of a free magnetic layer. FIG. 2 shows the basic multilayered structure including an even number of ferromagnetic layers of the free magnetic layer.

As shown in FIGS. 1 and 2, an antiferromagnetic layer 14 is formed on a lower electrode 12.

A pinned magnetic layer 16 of the multilayered synthetic antiferromagnet (SAF) structure is formed on the antiferromagnetic layer 14.

A nonmagnetic spacer layer 18 is formed on the pinned magnetic layer 16. The nonmagnetic spacer layer 18 is formed of a nonmagnetic conductor layer or a tunnel insulating film.

A free magnetic layer 20 is formed on the nonmagnetic spacer layer 18.

A nonmagnetic spacer layer 22 is formed on the free magnetic layer 20. The nonmagnetic spacer 22 is formed of a nonmagnetic conductor layer or a tunnel insulating film.

A pinned magnetic layer 24 of the multilayered SAF structure is formed on the nonmagnetic spacer layer 22.

An antiferromagnetic layer 26 is formed on the pinned magnetic layer 24.

A cap layer 28 of a nonmagnetic conductor material is formed on the antiferromagnetic layer 26.

As described above, the magnetoresistive effect element according to the present invention includes the dual pin structure having the pinned magnetic layers 16, 24 respectively formed on the underside of the free magnetic layer 20 and the upper side of the free magnetic layer 20.

The free magnetic layer 20 is formed of a single ferromagnetic layer, or a plurality of ferromagnetic layers laid one on another with a nonmagnetic layer formed between the ferromagnetic layers. With a plurality of ferromagnetic layers laid one on another, the free magnetic layer 20 has the multilayered SAF structure.

In the magnetoresistive effect element according to the present invention, the free magnetic layer 20/the nonmagnetic spacer layer 18/the pinned magnetic layer 16 form the magnetoresistive effect unit, whose resistance is changed by the spin transfer torque switching mechanism. Also, the pinned magnetic layer 24/the nonmagnetic spacer layer 22/the free magnetic layer 20 form the magnetoresistive effect unit, whose resistance is changed by the spin transfer torque switching mechanism. A resistance change of the magnetoresistive effect unit formed of the free magnetic layer 20/the nonmagnetic spacer layer 18/the pinned magnetic layer 16 and a resistance change of the magnetoresistive effect unit of the pinned magnetic layer 24/the nonmagnetic spacer layer 22/the free magnetic layer 20 are different form each other by, e.g., above 10 times including 10 times. The thicknesses and the materials of the nonmagnetic spacer layers 18, 22 are set so that resistance changes of the two magnetoresistive effect units so differ from each other.

Numbers of the layers of the pinned magnetic layers 16, 24 having the multilayered SAF structure are as follows corresponding to numbers of the layers of the ferromagnetic layers of the free magnetic layer.

First, when a number of the ferromagnetic layers of the free magnetic layer 20 is odd (2m+1 where m is 0 or a positive integer), the number of the ferromagnetic layers of one of the pinned magnetic layers 16, 24 is 2n (n is a positive integer), and the number of the ferromagnetic layer of the other pinned magnetic layer is 2n+1 (n is a positive integer). The numbers of the ferromagnetic layers of the pinned magnetic layers 16, 24 are thus set, whereby the magnetization direction of the ferromagnetic layer of the pinned magnetic layer 16, which is nearest the free magnetic layer 20 is opposite to the magnetization direction of the ferromagnetic layer of the pinned magnetic layer 24, which is nearest the free magnetic layer 20.

FIG. 1 shows the multilayered structure including the free magnetic layer 20 formed of a single ferromagnetic layer.

As shown, the pinned magnetic layer 16 on the underside of the free magnetic layer 20 is formed of a ferromagnetic layer (a lower pinned magnetic layer) 16a, a nonmagnetic layer 16b and a ferromagnetic layer (an upper pinned magnetic layer) 16c laid the latter on the former. That is, the pinned magnetic layer 16 includes two ferromagnetic layers 16a, 16c. On the other hand, the pinned magnetic layer 24 on the upper side of the free magnetic layer 20 includes a ferromagnetic layer (a lower pinned magnetic layer) 24a, a nonmagnetic layer 24b, a ferromagnetic layer (a middle pinned magnetic layer) 24c, a nonmagnetic layer 24d and a ferromagnetic layer (an upper pinned magnetic layer) 26c laid the latter on the former. That is, the pinned magnetic layer 24 includes three ferromagnetic layer 24a, 24c, 24e. In the multilayered structure shown in FIG. 1, the magnetization direction of the upper pinned magnetic layer 16c forming the pinned magnetic layer 16 and the magnetization direction of the lower pinned magnetic layer 24a forming the pinned magnetic layer 24 are opposite to each other.

In contrast to this, in the multilayered structure including the free magnetic layer 20 having an even number (2m where m is a positive integer) of ferromagnetic layers, the number of the ferromagnetic layers of one of the pinned magnetic layers 16, 24 is 2n (n is a positive integer), and the number of the ferromagnetic layers of the other pinned magnetic layer is also 2n (n is a positive integer). The number of the ferromagnetic layers of the pinned magnetic layers 16, 24 are thus set, whereby the magnetization direction of the ferromagnetic layer of the pinned magnetic layer 16, which is nearest the free magnetic layer 20 and the magnetization direction of the ferromagnetic layer of the pinned magnetic layer 24, which is nearest the free magnetic layer 20, are the same.

FIG. 2 shows the multilayered structure including the free magnetic layer 20 having two ferromagnetic layers.

As shown, the free magnetic layer 20 is formed of a ferromagnetic layer (a lower free magnetic layer) 20a, a nonmagnetic layer 20b and a ferromagnetic layer (an upper free magnetic layer) 20c laid the latter on the former. The pinned magnetic layer 16 on the underside of the free magnetic layer 20 is formed of a ferromagnetic layer (a lower pinned magnetic layer) 16a, a nonmagnetic layer 16b and a ferromagnetic layer (an upper pinned magnetic layer) 16c laid the latter on the former. That is, the pinned magnetic layer 16 includes two ferromagnetic layers 16a, 16c. On the other hand, the pinned magnetic layer 24 on the upper side of the free magnetic layer 20 is formed of a ferromagnetic layer (a lower pinned magnetic layer) 24a, a nonmagnetic layer 24b and a ferromagnetic layer (an upper pinned magnetic layer) 24c laid the latter on the former. That is, the pinned magnetic layer 24 includes two ferromagnetic layers 24a, 24c. In the multilayered structure shown FIG. 2, the magnetization direction of the upper pinned magnetic layer 16c forming the pinned magnetic layer 16 and the magnetization direction of the lower pinned magnetic layer 24a forming the pinned magnetic layer 24 are the same.

As described above, the pinned magnetic layers 16, 24 each have the multilayered SAF structure including a plurality of ferromagnetic layers laid with a nonmagnetic layer formed between the ferromagnetic layers. In the magnetoresistive effect element according to the present invention, the saturation magnetization and the thickness of the respective ferromagnetic layers forming the pinned magnetic layers 16, 24 are suitably set so that the magnetic moments of the pinned magnetic layers 16, 24 are sufficiently decreased by the antiferromagnetic coupling.

In the pinned magnetic layers 16, 24 of the multilayered SAF structure, the magnetization direction of the first ferromagnetic layer and the magnetization direction of the odd number-th ferromagnetic layers after the third layer including the third layer are the same. The magnetization direction of the second ferromagnetic layer and the magnetization direction of the even number-th ferromagnetic layers after the fourth layer including the fourth layer are the same. The magnetization direction of the first ferromagnetic layer and the odd number-th layer after the third layer including the third layer, and the magnetization direction of the second ferromagnetic layer and the even number-th layer after the fourth layer including the fourth layer are opposed to each other.

Generally, the magnetic moment Mst of the pinned magnetic layer of the multilayered SAF structure is expressed by $$MSt = Ms_1 \times t_1 + Ms_2 \times t_2 + Ms_3 \times t_3 + \ldots = \Sigma(Ms_i \times t_i)$$

where a saturation magnetization of the i-th (i=1, 2, 3, ...) ferromagnetic layer forming the pinned magnetic layer is $Ms_i$, and a thickness is $t_i$.

Accordingly, the saturation magnetization $Ms_i$ and the thickness $t_i$ of the respective ferromagnetic layers are suitably set, whereby the magnetic moment of the pinned magnetic layer of the multilayered SAF structure can be sufficiently decreased.

In the magnetoresistive effect element according to the present invention, the saturation magnetization and the thickness of the respective ferromagnetic layers forming the pinned magnetic layers 16, 24 are suitably set, whereby the magnetic moments of the pinned magnetic layers 16, 24 are sufficiently decreased. That is, the magnetic moment $Mst_1$ of the pinned magnetic layer 16 is smaller than, e.g., a value of $\frac{1}{10}$ of the minimum value $Min(Ms_i \times t_i)$ among the magnetic moments $Ms_i \times t_i$ of the respective ferromagnetic layers forming the pinned magnetic layer 16. Similarly, the magnetic moment $Mst_2$ of the pinned magnetic layer 24 is smaller than a value of $\frac{1}{10}$ of the minimum value $Min(Ms_i \times t_i)$ among the magnetic moments $Ms_i \times t_i$ of the respective magnetic layers forming the pinned magnetic layer 24.

As described above, one major characteristic of the magnetoresistive effect element according to the present invention is that in the dual pin structure having the pinned magnetic layers 16, 24 formed respectively on the underside and the upper side of the free magnetic layer 20, a resistance change of the magnetoresistive effect unit formed of the free magnetic layer 20/the nonmagnetic spacer layer 18/the pinned magnetic layer 16, and a resistance change of the magnetoresistive effect unit formed of the pinned magnetic layer 24/the nonmagnetic spacer layer 22/the free magnetic layer 20 are different from each other by, e.g., above 10 times including 10 times.

In the magnetoresistive effect element of the dual pin structure having the pinned magnetic layers respectively formed on the underside and the upper side of the free magnetic layer, the following disadvantage takes place when the structures on the underside and the upper side of the free magnetic layer are formed of materials which make the magnetoresistive effect changes equal to each other. That is, when the magnetization direction of the free magnetic layer is switched, the resistances change symmetrically on the underside and on the upper side of the free magnetic layer. Resultantly, disadvantages that no resistance change takes place in the magnetoresistive effect element as a whole, or only a slight resistance change takes place.

In the magnetoresistive effect element according to the present invention, a resistance change of the magnetoresistive effect unit formed of the free magnetic layer 20/the nonmagnetic spacer layer 18/the pinned magnetic layer 16 and a resistance change of the magnetoresistive effect unit formed of the pinned magnetic layer 24/the nonmagnetic spacer layer 22/the free magnetic layer 20 are different form each other by, e.g., above 10 times including 10 times. This prohibits the above-described disadvantages and provides large resistance change in the magnetoresistive effect element as a whole.

Figure 3:
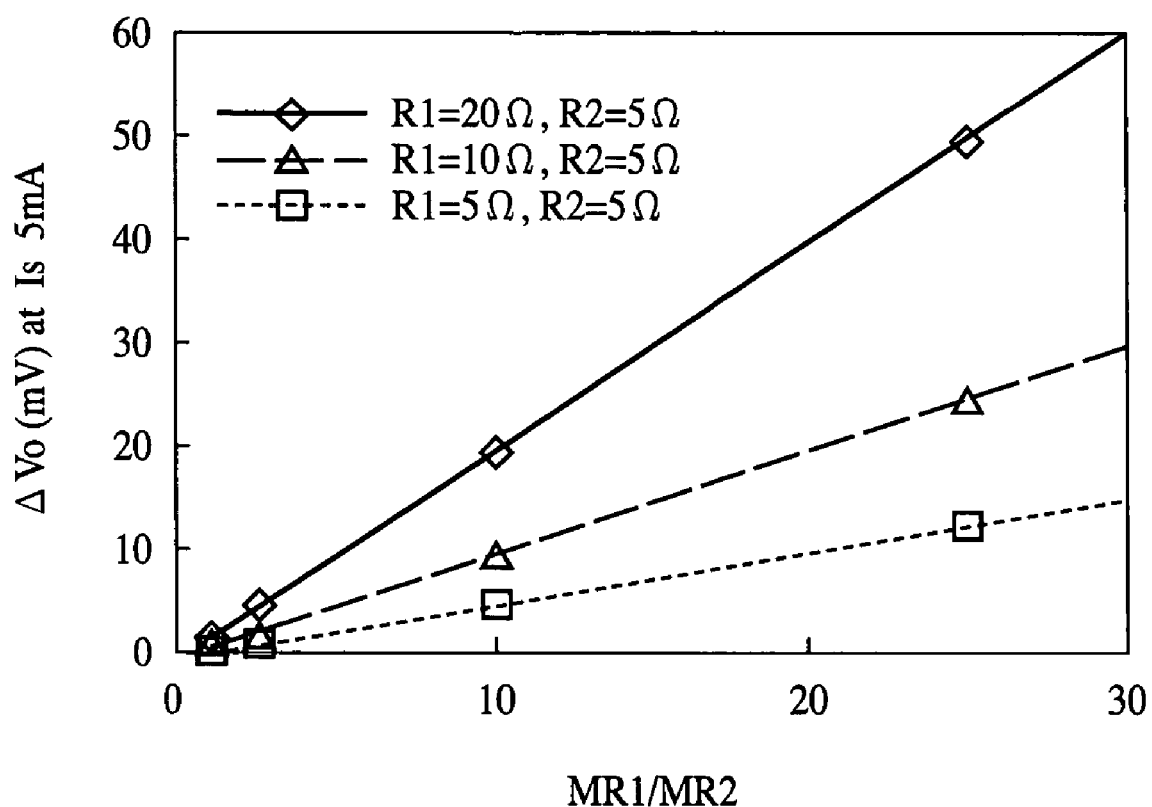
FIG. 3 is a graph of relationships between output voltage changes and ratios of magnetic resistance changes of the nonmagnetic spacer layers of the magnetoresistive effect element according to the present invention.

FIG. 3 is a graph of relationships between output voltage changes of the magnetoresistive effect element, and ratios between magnetic resistance changes of the magnetoresistive effect units including the nonmagnetic spacer layers 18, 22.

In the graph, output voltage changes ΔVo corresponding to resistance changes with a 5 mA current Is applied to the magnetoresistive effect element are plotted corresponding to ratios MR1/MR1. Here, MR1 indicates resistance changes of the magnetoresistive effect unit formed of the free magnetic layer 20/the nonmagnetic spacer layer 18/the pinned magnetic layer 16. MR2 indicates resistance changes of the magnetoresistive effect unit formed of the pinned magnetic layer 24/the nonmagnetic spacer layer 22/the free magnetic layer 20. In the graph, when the resistance of the nonmagnetic spacer layer 18 is R1, and the resistance of the nonmagnetic spacer layer 22 is R2, the □ marks indicate the case of R1=5Ω and R2=5Ω. The ∆marks indicate the case of R1=10Ω and R2=5Ω. The ◊ marks indicate the case of R1=20Ω, and R2=5Ω. The free magnetic layer 20 is formed of a CoFeB film, a Ru film and a CoFeB film laid one on another. The pinned magnetic layers 16, 24 are each formed of a CoFe film, a Ru film and a CoFe film laid one on another. The antiferromagnetic layers 14, 26 are both formed of an IrMn film.

As evident from the respective plots, it is found that the output voltage change ∆Vo is proportional to the ratio MR1/MR2. Accordingly, the ratio NR1/MR2 is made larger, whereby larger output voltage change ∆Vo can be obtained.

To make the memory operation stable when the magnetoresistive effect element is applied to an MRAM, the output voltage change ∆Vo must be large. Accordingly, it is preferable that the ratio MR1/MR2 is large, although depending on the sensitivity and accuracy of the resistance change detecting circuit.

For example, when R1=10Ω and R2=5Ω, the output voltage change ∆Vo is above 9 mV with the ratio MR1/MR2 being above 10 including 10. In order to make the memory operation stable, in consideration of errors in the voltage comparison and, output variations, etc., the MR1/MR2 is preferably set at, e.g., above 10 including 10. That is, it is preferable to differ a resistance change of the magnetoresistive effect unit formed of the free magnetic layer 20/the nonmagnetic spacer layer 18/the pinned magnetic layer 16 and a resistance change of the magnetoresistive effect unit formed of the pinned magnetic layer 24/the nonmagnetic spacer layer 22/the free magnetic layer 20 from each other by, e.g., above 10 ties including 10 times.

Another major characteristic of the magnetoresistive effect element according to the present invention is that the numbers of the ferromagnetic layers of the pinned magnetic layers 16, 24 of the multilayered SAF structure are suitably set in accordance with the number of the ferromagnetic layers of the free magnetic layer 20, whereby the magnetization directions of the ferromagnetic layers of the pinned magnetic layers 16, 24, which are nearest the free magnetic layer 20, are oriented in the prescribed directions.

That is, when the number of the ferromagnetic layers of the free magnetic layer 20 is an odd number (2m+1 where m is 0 or a positive integer), the number of the ferromagnetic layers of one of the pinned magnetic layers 16, 24 is set at 2n (n is a positive integer), and the number of the ferromagnetic layers of the other pinned magnetic layer is set at 2n+1 (n is a positive integer), whereby the magnetization direction of the pinned magnetic layer 16 on the side of free magnetic layer 20 and the magnetization direction of the pinned magnetic layer 24 on the side of the free magnetic layer 20 are opposite to each other.

When the number of the ferromagnetic layers of the free magnetic layer 20 is an even number (2m where m is a positive integer), the number of the ferromagnetic layers of one of the pinned magnetic layers 16, 24 is set at 2n (n is a positive integer), and the number of the ferromagnetic layers of the other pinned magnetic layer is set also at 2n (n is a positive integer), whereby the magnetization direction of the pinned magnetic layer 16 on the side of the free magnetic layer 20, and the magnetization direction of the pinned magnetic layer 24 on the side of the free magnetic layer 20 are the same.

As described above, the numbers of the ferromagnetic layers of the pinned magnetic layers 16, 24 are suitably set in accordance with the number of the ferromagnetic layers of the free magnetic layer 20, whereby the direction of current to be applied to the magnetoresistive effect element is only changed irrespective of the magnetization direction of the free magnetic layer 20 to thereby surely inject electrons of an opposite spin into the free magnetic layer 20. Accordingly, the resistance change can be obtained without depending on the magnetization reversing by the spin transfer using the reflected electrons, and the magnetization reversing current can be decreased, and resistance-current hysteresis characteristic of good symmetry can be obtained.

Further another major characteristic of the magnetoresistive effect element according to present invention is that the saturation magnetization and the thickness of the respective ferromagnetic layers forming the pinned magnetic layers 16, 24 are suitably set, whereby the magnetic moments of the pinned magnetic layers 16, 24 are sufficiently decreased.

That is, the magnetic moment Mst of the pinned magnetic layer 16 is smaller than $1/10$ of, e.g., the minimum value $Min(Ms_i \times t_i)$ among the magnetic moments $Ms_i \times t_i$ of the respective ferromagnetic layers forming the pinned magnetic layer 16. Similarly, the magnetic moment Mst of the pinned magnetic layer 24 is smaller than, e.g., $1/10$ of the minimum value $Min(Ms_i \times t_i)$ among the magnetic moments $Ms_i \times t_i$ of the respective ferromagnetic layers forming the pinned magnetic layer 14.

As described above, the magnetoresistive effect element according to the present invention has the magnetic moments of the pinned magnetic layers 16, 24 of the multilayered SAF structure sufficiently decreased, whereby the magnetic coupling between the pinned magnetic layers 16, 24 and the free magnetic layer 20 can be suppressed. Accordingly, the shift of the resistance-current hysteresis characteristic can be sufficiently suppressed.

A First Eembodiment

Figure 4:
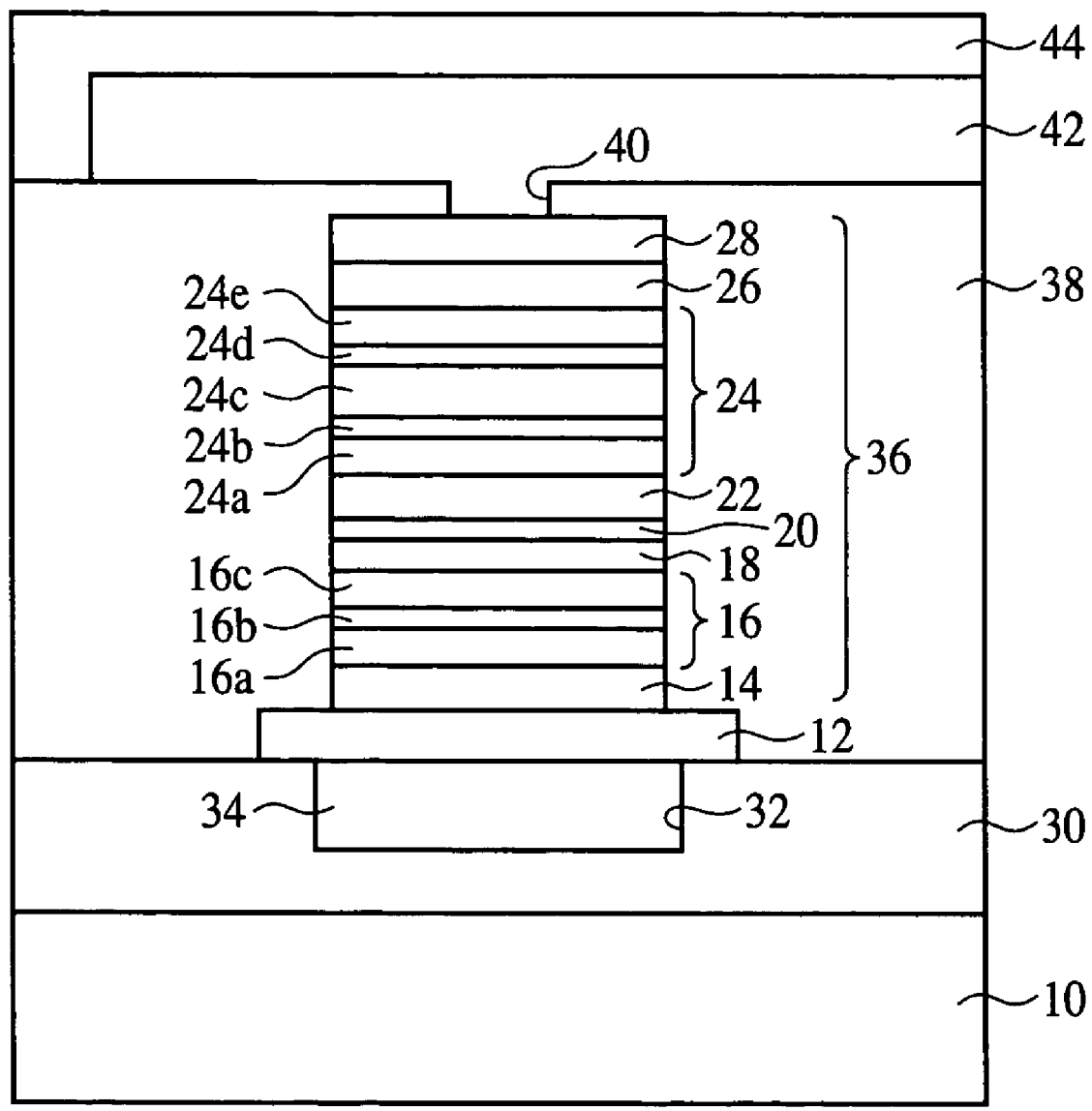
FIG. 4 is a diagrammatic sectional view showing a structure of the magnetoresistive effect element according to a first embodiment of the present invention.
Figure 5:
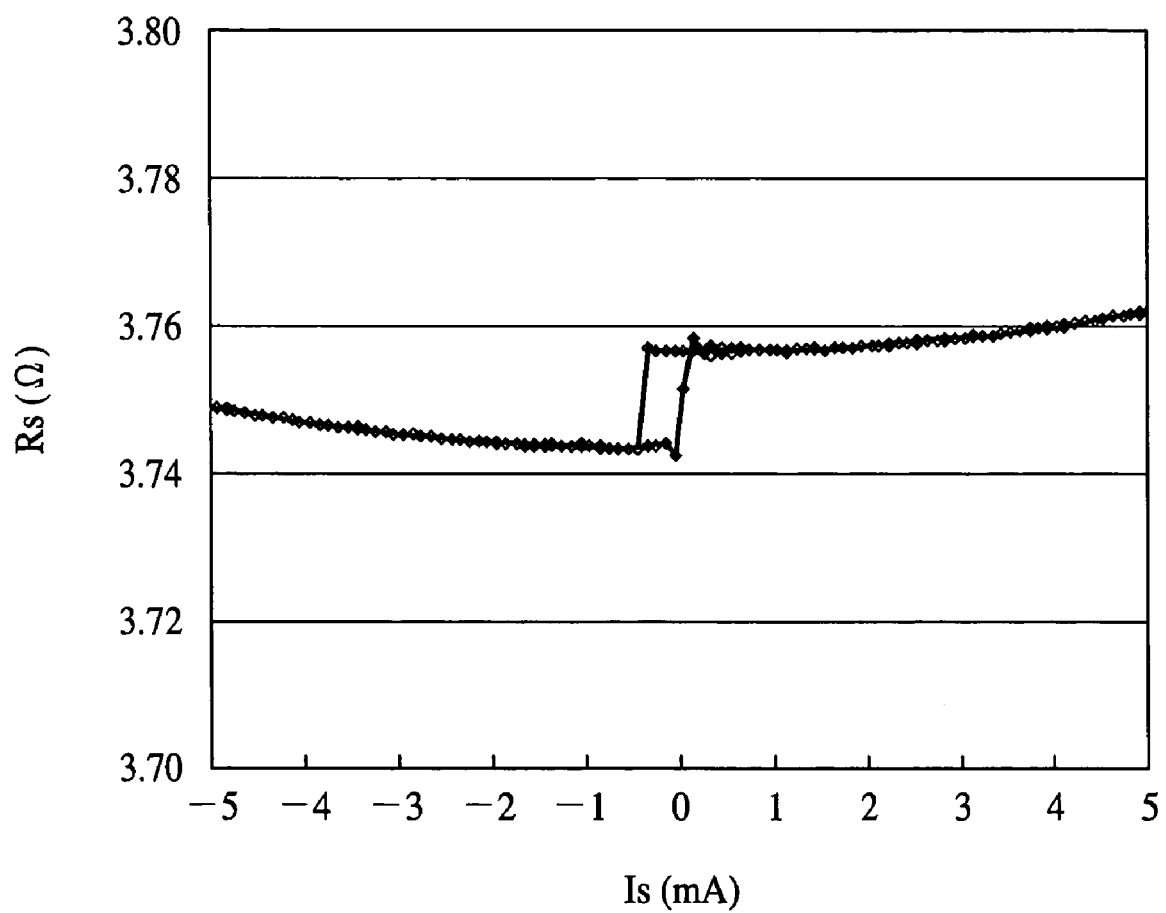
FIG. 5 is a graph of the resistance-current hysteresis characteristic of the magnetoresistive effect element according to the first embodiment of the present invention.

The magnetoresistive effect element and the method for fabricating the same according to a first embodiment of the present invention will be explained with reference to FIGS. 4, 5, 6A-6B, 7A-7B, 8A-8B and 9A-9B. FIG. 4 is a diagrammatic sectional view showing a structure of the magnetoresistive effect element according to the present embodiment. FIG. 5 is a graph of the resistance-current hysteresis characteristic of the magnetoresistive effect element according to the present embodiment. FIGS. 6A-6B, 7A-7B, 8A-8B and 9A-9B are sectional views of the magnetoresistive effect element according to the present embodiment in the steps of the method for fabricating the same, which show the method.

First, the structure of the magnetoresistive effect element according to the present embodiment will be explained with reference to FIG. 4.

As shown in FIG. 4, an inter-layer insulating film 30 is formed on a silicon substrate 10. An interconnection trench 32 is formed in the inter-layer insulating film 30. An interconnection (word line) 34 is buried in the interconnection trench 32.

On the inter-layer insulating film 30 with the interconnection 34 buried in, a lower electrode 12 of, e.g., a 50 nm-thickness Cu film is formed.

On the lower electrode 12, an antiferromagnetic layer 14 of, e.g., a 15 nm-thickness IrMn film.

On the antiferromagnetic layer 14, a pinned magnetic layer 16 of the multilayered SAF structure is formed. The pinned magnetic layer 16 is formed of a ferromagnetic layer (the lower pinned magnetic layer) 16a of, e.g., a 4 nm-thickness CoFe film, a nonmagnetic layer 16b of, e.g., a 0.8 nm-thickness Ru film, and a ferromagnetic layer (the upper pinned magnetic layer) 16c of, e.g., a 4 nm-thickness CoFe film which are laid the latter on the former.

A nonmagnetic spacer layer 18 is formed on the pinned magnetic layer 16. The nonmagnetic spacer layer 18 is formed of a nonmagnetic conductor layer of, e.g., a 3 nm-thickness Cu film.

On the nonmagnetic spacer layer 18, a free magnetic layer 20 of, e.g., a 2 nm-thickness CoFeB film is formed. The free magnetic layer 20 is formed of a single ferromagnetic layer.

On the free magnetic layer 20, a nonmagnetic spacer layer 22 is formed. The nonmagnetic spacer layer 22 is formed of a nonmagnetic conductor layer of, e.g., a 6 nm-thickness Cu film.

On the nonmagnetic spacer layer 22, a pinned magnetic layer 24 having the multilayered SAF structure is formed. The pinned magnetic layer 24 is formed of the ferromagnetic layer (the lower pinned magnetic layer) 24a of, e.g., a 4 nm-thickness CoFe film, the nonmagnetic layer 24b of, e.g., a 0.8 nm-thickness Ru film, the ferromagnetic layer (the middle pinned magnetic layer) 24c of, e.g., a 8 nm-thickness CoFe film, the nonmagnetic layer 24d of, e.g., a 0.8 nm-thickness Ru film, and the ferromagnetic layer (the upper pinned magnetic layer) 24e of, e.g., a 4 nm-thickness CoFe film which are laid the latter on the former.

On the pinned magnetic layer 24, an antiferromagnetic layer 26 of, e.g., a 15 nm-thickness IrMn film is formed.

On the pinned magnetic layer 26, a cap layer 28 of, e.g., a 10 nm-thickness Ru film is formed.

Thus, a magnetoresistive effect element 36 according to the present embodiment including the antiferromagnetic layer 14, the pinned magnetic layer 16, the nonmagnetic spacer layer 18, the free magnetic layer 20, the nonmagnetic spacer layer 22, the pinned magnetic layer 24, the antiferromagnetic layer 26 and the cap layer 28 laid the latter on the former is formed on the lower electrode 12. The magnetoresistive effect element 36 according to the present embodiment has the dual pin structure having the pinned magnetic layer 16 formed on the underside of the free magnetic layer 20 with the nonmagnetic conductor layer 18 formed therebetween and the pinned magnetic layer 24 formed on the upper side of the free magnetic layer 20 with the nonmagnetic conductor layer 22 formed therebetween. The size of the magnetoresistive effect element is, e.g., 127 nm×260 nm.

In the magnetoresistive effect element according to the present embodiment, the nonmagnetic spacer layer 22 is formed of Cu film, as is the nonmagnetic spacer layer 18, and is thicker than the nonmagnetic spacer layer 18. Accordingly, a resistance change of the magnetoresistive effect unit formed of the pinned magnetic layer 24/the nonmagnetic spacer layer 22/the free magnetic layer 20 is larger than a resistance change of the magnetoresistive effect unit formed of the free magnetic layer 20/the nonmagnetic spacer layer 18/the pinned magnetic layer 16.

While the free magnetic layer 20 includes a single ferromagnetic layer, the number of the ferromagnetic layer of the pinned magnetic layer 16 is two, and the number of the ferromagnetic layer of the pinned magnetic layer 24 is three. Thus, the magnetization direction of the ferromagnetic layer 16c of the pinned magnetic layer 16, which is nearest the free magnetic layer 20, and the magnetization direction of the ferromagnetic layer 24a of the pinned magnetic layer 24, which is nearest the free magnetic layer 20, are opposite to each other.

On the inter-layer insulating film 30 with the magnetoresistive effect element 36 formed on, an inter-layer insulating film 38 is formed. A contact hole 40 is formed in the inter-layer insulating film 38 down to the cap layer 28.

On the inter-layer insulating film 38, an interconnection (bit line) 42 is formed, electrically connected to the cap layer 28 of the magnetoresistive effect element 36 via the contact hole 40.

On the inter-layer insulating film 38 with the interconnection 42 formed on, an inter-layer insulating film 44 is formed.

In forming a passive matrix magnetic memory device using the magnetoresistive effect elements 36 according to the present embodiment as the memory elements, a plurality of the interconnections (the word lines) 34 are formed in parallel with each other, extended in a prescribed direction, and a plurality of the interconnections (the bit lines) 42 are formed in parallel with each other, extended, e.g., normal to the word lines 34. The magnetoresistive effect elements 36 are formed at the respective intersections between the word lines 34 and the bit lines 42, electrically connected to the word lines 34 and the bit lines 42.

One major characteristic of the magnetoresistive effect element 36 according to the present invention is that in the dual pin structure having the pinned magnetic layers 16, 24 formed respectively on the underside and the upper side of the free magnetic layer 20, a resistance change of the magnetoresistive effect unit formed of the pinned magnetic layer 24/the magnetic spacer layer 22/the free magnetic layer 20 is larger than a resistance change of the magnetoresistive effect unit formed of the free magnetic layer 20/the nonmagnetic spacer layer 18/the pinned magnetic layer 16.

Thus, disadvantage that the resistance change of the magnetoresistive effect element 36 as a whole is not generated or much decreased is prevented, whereby the magnetoresistive effect element 36 as a whole can have large resistance change.

Another major characteristic of the magnetoresistive effect element 36 according to the present embodiment is that the magnetization direction of the ferromagnetic layer 16c of the pinned magnetic layer 16, which is nearest the free magnetic layer 20, and the magnetization direction of the ferromagnetic layer 24a of the pinned magnetic layer 24, which is nearest the free magnetic layer 20, are opposite to each other with respect to the free magnetic layer 20 formed of a single ferromagnetic layer.

The magnetization directions of the pinned magnetic layers 16, 24 are so set, whereby electrons having the opposite spin can be surely injected into the free magnetic layer 20 of a single ferromagnetic layer irrespective of a magnetization direction of the free magnetic layer 20 only by changing a direction of a current to be applied to the magnetoresistive effect element 36. Accordingly, the resistance change can be obtained independently of the magnetization reversing by the spin transfer of the reflected electrons, and the resistance-current hysteresis characteristic of good symmetry can be obtained.

Further another characteristic of the magnetoresistive effect element 36 according to the present embodiment is that the saturation magnetization and the thickness of the respective ferromagnetic layers forming the pinned magnetic layers 16, 24 of the multilayered SAF structure are suitably set to thereby sufficiently decrease the magnetic moments of the pinned magnetic layer 16, 24.

Specifically, as for the pinned magnetic layer 16, the ferromagnetic layers 16a, 16c are both formed of the same ferromagnetic material, CoFe film and both have, e.g., a 4 nm-thickness. Accordingly, the magnetic moment $Mst_1$ of the pinned magnetic layer 16 is given by $$Mst_1 = Ms_{CoFe} \times 4 - Ms_{CoFe} \times 4$$
$$= Ms_{CoFe} \times (4-4)$$
$$= 0$$

when the magnetization direction of the ferromagnetic layer 16a is + direction, and a saturation magnetization of CoFe is $Ms_{CoFe}$, because the magnetization direction of the ferromagnetic layer 16c is − direction.

As for the pinned magnetic layer 24, the ferromagnetic layers 24a, 24c, 24e are formed of the same ferromagnetic material, CoFe film and respectively have, e.g., a 4 nm-thickness, an 8 nm-thickness and a 4 nm-thickness. Accordingly, the magnetic moment $Mst_2$ of the pinned magnetic layer 24 is given by $$Mst_2 = Ms_{CoFe} \times 4 - Ms_{CoFe} \times 8 + Ms_{CoFe} \times 4$$
$$= Ms_{CoFe}(4-8+4)$$
$$= 0$$

when the magnetization direction of the ferromagnetic layer 24a is + direction, and a saturation magnetization of CoFe is $Ms_{CoFe}$, because the magnetization direction of the ferromagnetic layer 24c is − direction and the magnetization direction of the ferromagnetic layer 24e is + direction.

As described above, in the magnetoresistive effect element 36 according to the present embodiment, the saturation magnetization and the thickness of the respective ferromagnetic layers forming the pinned magnetic layers 16, 24 are suitably set to thereby decrease the magnetic moments of the pinned magnetic layers 16, 24, whereby the magnetic coupling between the pinned magnetic layers 16, 24, and the free magnetic layer 20 can be suppressed. Accordingly, the shift of the resistance-current hysteresis characteristic can be sufficiently suppressed.

The magnetic moments $Mst_1$, $Mst_2$ of the pinned magnetic layers 16, 24 may not be essentially 0. The magnetic moment $Mst_1$ of the pinned magnetic layer 16 may be smaller than, e.g., a value of 1/10 of the minimum value among the magnetic moments of the respective ferromagnetic layers forming the pinned magnetic layer 16. Similarly, the magnetic moment $Mst_2$ of the pinned magnetic layer 24 is smaller than, e.g., a value of 1/10 of the minimum value among the magnetic moments of the respective ferromagnetic layers forming the pinned magnetic layer 24.

FIG. 5 is a graph of the resistance-current hysteresis characteristic of the magnetoresistive effect element according to the present embodiment given by measuring the resistance $R_s$ to the applied current $I_s$ of the magnetoresistive effect element according to the present embodiment.

As evident from the graph, it has been confirmed that the magnetoresistive effect element according to the present embodiment can obtain resistance-current hysteresis characteristic having good symmetry and the shift suppressed. The critical current density $J_c$ at this time was $6.1 \times 10^5$ A/cm$^2$, and the magnetoresistive effect element according to the present embodiment can decrease the critical current density by 1-2 places in comparison with the conventional magnetoresistive effect element.

Next, the method for fabricating the magnetoresistive effect element according to the present embodiment will be explained with reference to FIGS. 6A-6B, 7A-7B, 8A-8B and 9A-9B.

First, a silicon oxide film is deposited on the silicon substrate 10 by, e.g., CVD method to form the inter-layer insulating film 30 of the silicon oxide film.

Figure 6A:
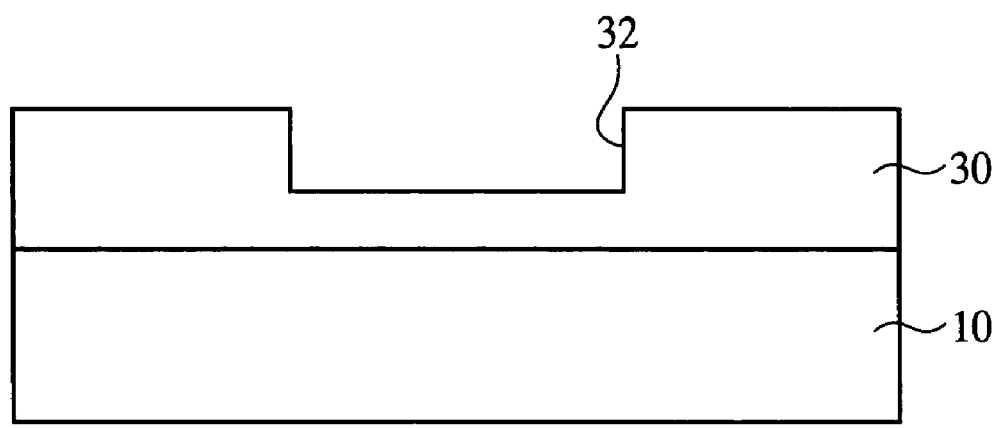
FIGS. 6A-6B, 7A-7B, 8A-8B and 9A-9B are sectional views of the magnetoresistive effect element according to the first embodiment of the present invention in the steps of the method for fabricating the same, which show the method.

Next, the interconnection trench 32 is formed in the inter-layer insulating film 30 by photolithography and dry etching (FIG. 6A).

Figure 6B:
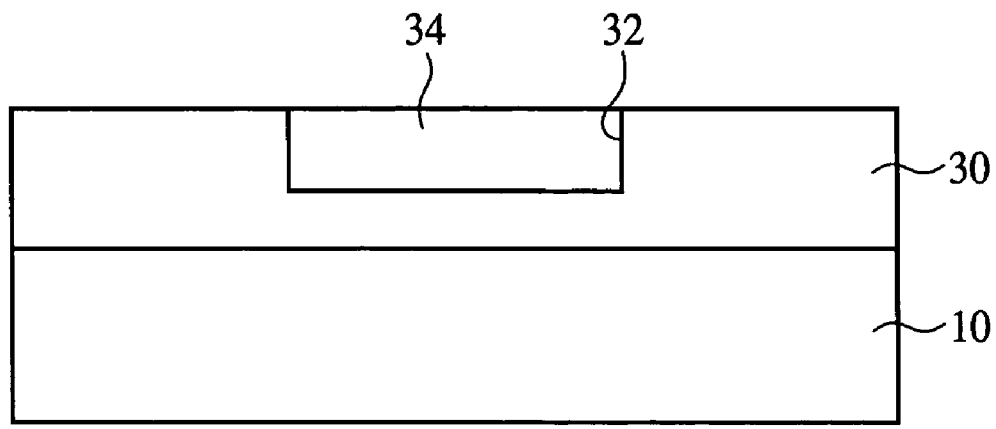

Then, a conductive film is deposited on the inter-layer insulating film 30 with the interconnection trench 32 formed in, and the conductive film is planarized by CMP method until the inter-layer insulating film 30 is exposed. Thus, the interconnection 34 buried in the interconnection layer 32 is formed (FIG. 6B).

Next, a Cu film of, e.g., a 50 nm-thickness is deposited on the inter-layer insulating film 30, to form the lower electrode 12 of the Cu film.

Next, an IrMn film of, e.g., a 15 nm-thickness is formed on the lower electrode 12 by, e.g., sputtering to form the antiferromagnetic layer 14 of the IrMn film.

Next, on the antiferromagnetic layer 14, the ferromagnetic layer 16a of a CoFe film of, e.g., a 4 nm-thickness, the nonmagnetic layer 16b of a Ru film of, e.g., a 0.8 nm-thickness and the ferromagnetic layer 16c of a CoFe film of, e.g., a 4 nm-thickness are laid the latter on the former by, e.g., sputtering. Thus, the pinned magnetic layer 16 of the multilayered SAF structure is formed.

Next, a Cu film of, e.g., a 3 nm-thickness is deposited on the pinned magnetic layer 16 by, e.g., sputtering to form the nonmagnetic spacer layer 18 of the Cu film.

Next, a CoFeB film of, e.g., a 2 nm-thickness is deposited on the nonmagnetic spacer layer 18 by, e.g., sputtering to form the free magnetic layer 20 of the CoFeB film.

Next, on the free magnetic layer 20, a Cu film of, e.g., a 6 nm-thickness is formed by, e.g., sputtering to form the nonmagnetic spacer layer 22 of the Cu film.

Then, on the nonmagnetic spacer layer 22, the ferromagnetic layer 24a of a CoFe film of, e.g., a 4 nm-thickness, the nonmagnetic layer 24b of a Ru film of, e.g., 0.8 nm-thickness, the ferromagnetic layer 24c of a CoFe film of, e.g., an 8 nm-thickness, the nonmagnetic layer 24d of a Ru film of, e.g., a 0.8 nm-thickness, and the ferromagnetic layer 24e of a CoFe film of, e.g., a 4 nm-thickness are laid the latter on the former by, e.g., sputtering. Thus, the pinned magnetic layer 24 of the multilayered SAF structure is formed.

Next, on the pinned magnetic layer 24, an IrMn film of, e.g., a 15 nm-thickness is deposited by, e.g., sputtering to form the antiferromagnetic layer 26 of the IrMn film.

Figure 7A:
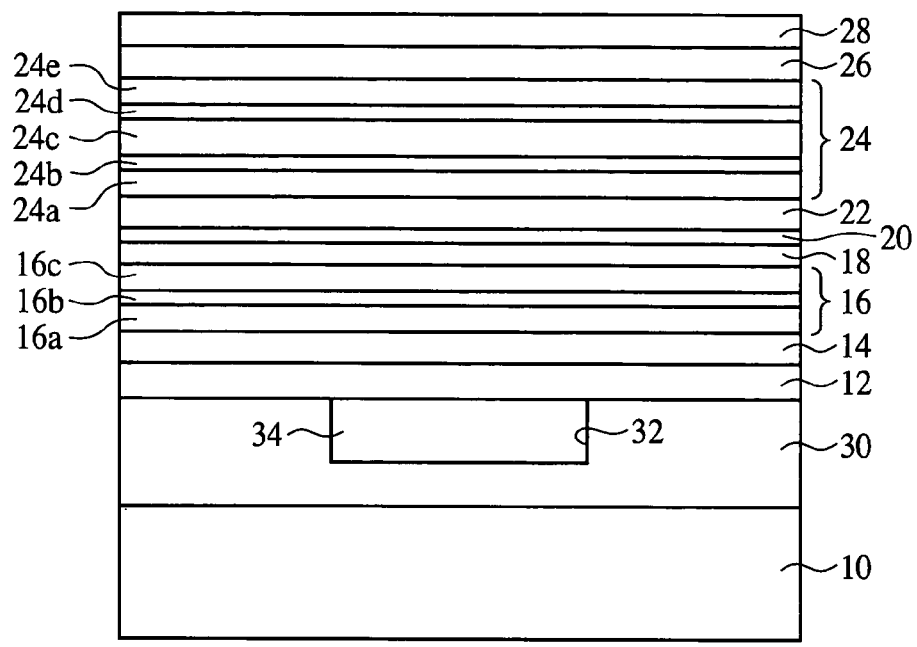

Next, on the antiferromagnetic layer 26, a Ru film of, e.g., a 10 nm-thickness is deposited to form the cap layer 28 of the Ru film (FIG. 7A).

Next, a photoresist film 46 having the pattern of the magnetoresistive effect element 36 to be fabricated is formed on the cap layer 28 by photolithography.

Figure 7B:
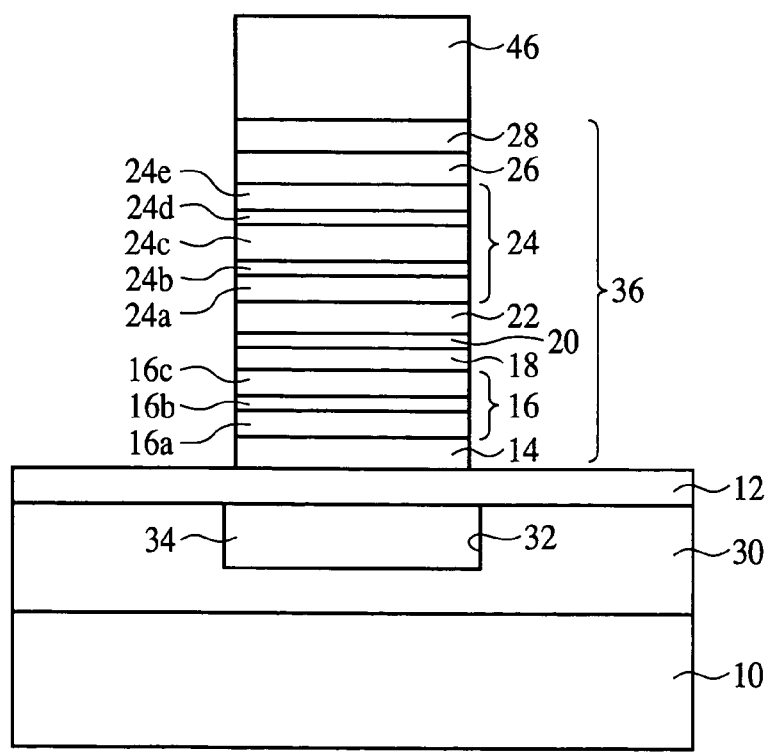

Then, with the photoresist film 46 as the mask, the cap layer 28, the antiferromagnetic layer 26, the pinned magnetic layer 24, the nonmagnetic spacer layer 22, the free magnetic layer 20, the nonmagnetic spacer layer 18, the pinned magnetic layer 16 and the antiferromagnetic layer 14 are anisotropically etched. Thus, the magnetoresistive effect element 36 of, e.g., a 127 nm×260 nm-size is fabricated (FIG. 7B)

Then, the photoresist film 46 is removed by, e.g., ashing.

Next, a photoresist film 48 covering the magnetoresistive effect element 36 is formed by photolithography.

Figure 8A:
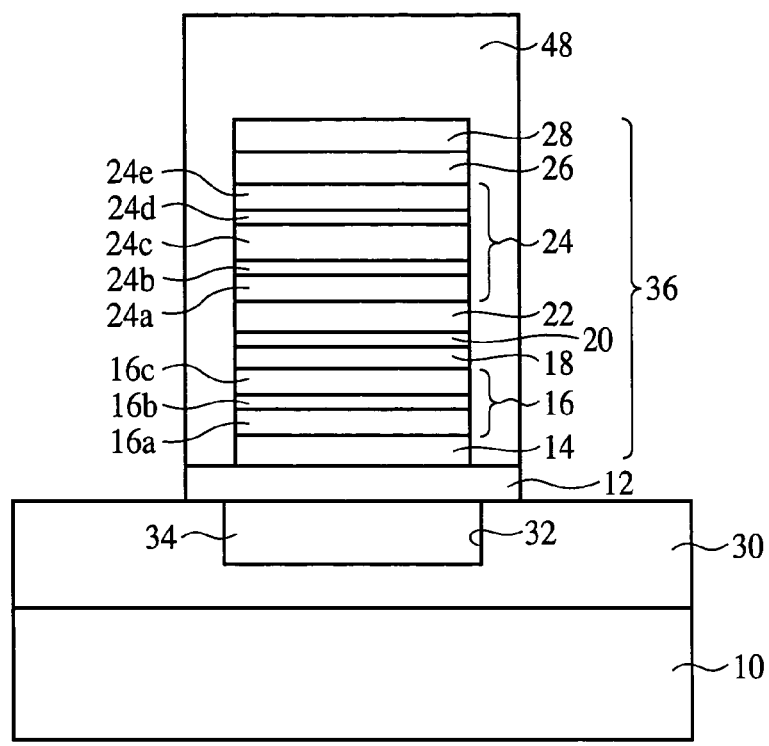

Next, with the photoresist film 48 as the mask, the lower electrode 12 is anisotropically etched to pattern the lower electrode 12 into a prescribed configuration (FIG. 8A).

Next, the photoresist film 48 is removed by, e.g., ashing.

Next, a silicon oxide film is deposited on the entire surface by, e.g., CVD method to form the inter-layer insulating film 38 of the silicon oxide film by, e.g., CVD method.

Figure 8B:
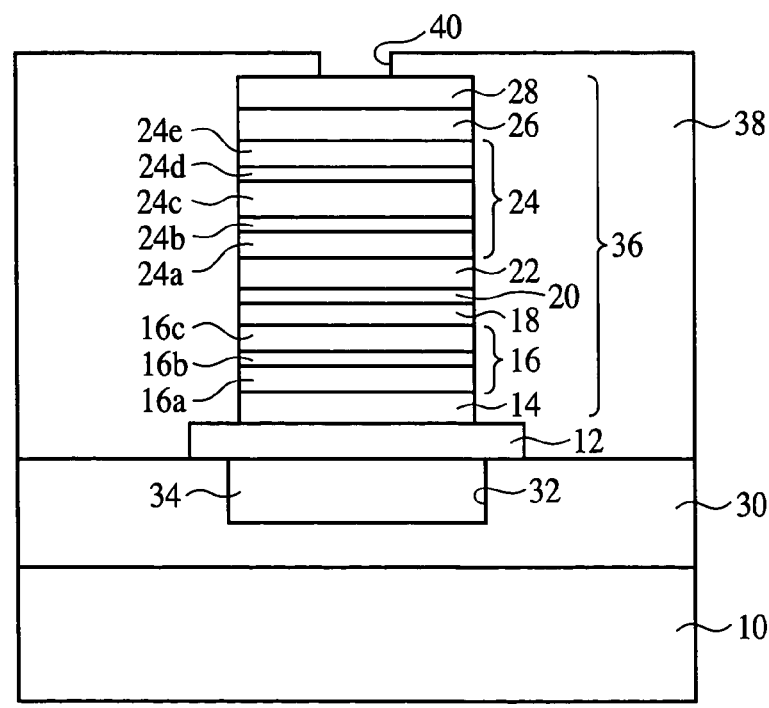

Next, the contact hole 40 is formed in the inter-layer insulating film 38 down to the cap layer 28 of the magnetoresistive effect element 36 by photolithography and dry etching (FIG. 8B).

Figure 9A:
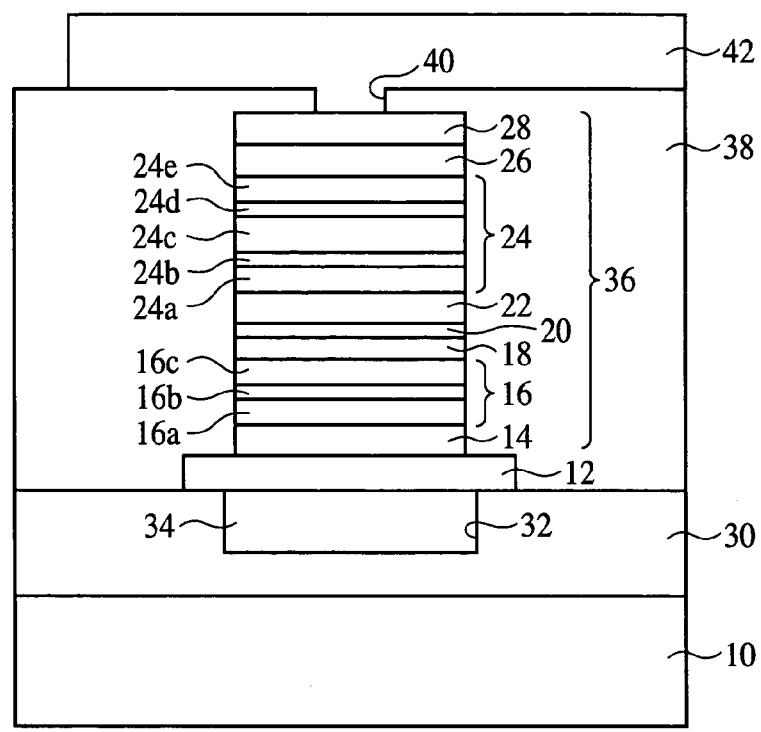

Next, a conductive film is deposited on the inter-layer insulating film 38 with the contact hole 40 formed in, and then the conductive film is patterned by photolithography and dry etching. Thus, the interconnection 42 is formed, electrically connected to the cap layer 28 of the magnetoresistive effect element 36 via the contact hole 40 (FIG. 9A).

Figure 9B:
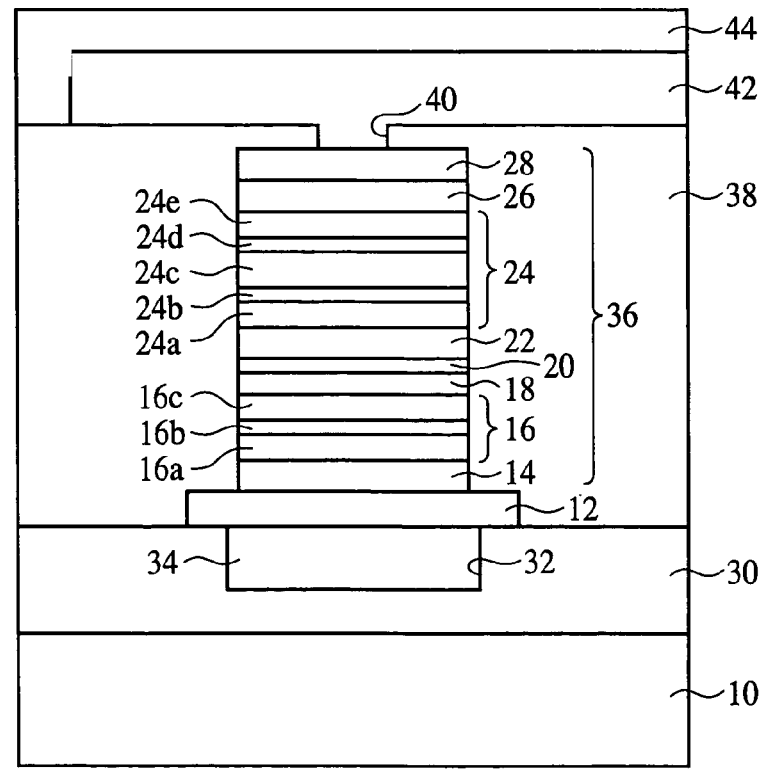

Next, a silicon oxide film, for example, is deposited on the entire surface by, e.g., CVD method to form the inter-layer insulating film 44 of the silicon oxide film (FIG. 9B).

Then, insulation films, interconnection layers, etc. are formed thereon as required.

As described above, according to the present embodiment, in the dual pin structure including the pinned magnetic layers 16, 24 formed respectively on the underside and the upper side of the free magnetic layer 20, a resistance change of the magnetoresistive effect unit formed of the pinned magnetic layer 24/the nonmagnetic spacer layer 22/the free magnetic layer 20 is larger than a resistance change of the magnetoresistive effect unit formed of the free magnetic layer 20/the nonmagnetic spacer layer 18/the pinned magnetic layer 16, whereby the disadvantage that the resistance change of the magnetoresistive effect element 36 as a whole is not generated or much decreased is prevented, and the magnetoresistive effect element 36 as a whole can have large resistance change.

According to the present embodiment, the magnetization direction of the ferromagnetic layer 16c of the pinned magnetic layer 16, which is nearest the free magnetic layer 20, and the magnetization direction of the ferromagnetic layer 24a of the pinned magnetic layer 24, which is nearest the free magnetic layer 20, are opposite to each other with respect to the free magnetic layer 20 formed of a single ferromagnetic layer, whereby the resistance change can be obtained independently of the magnetization reversing by the spin transfer of the reflected electrons, and the resistance-current hysteresis characteristic of good symmetry can be obtained.

According to the present embodiment, the saturation magnetization and the thickness of the respective ferromagnetic layers forming the pinned magnetic layers 16, 24 having the multilayered SAF structure are suitably set to thereby decrease the magnetic moments of the pinned magnetic layers 16, 24, whereby the magnetic coupling between the pinned magnetic layers 16, 24, and the free magnetic layer 20 can be suppressed. Accordingly, the shift of the resistance-current hysteresis characteristic can be sufficiently suppressed.

A Second Embodiment

Figure 10:
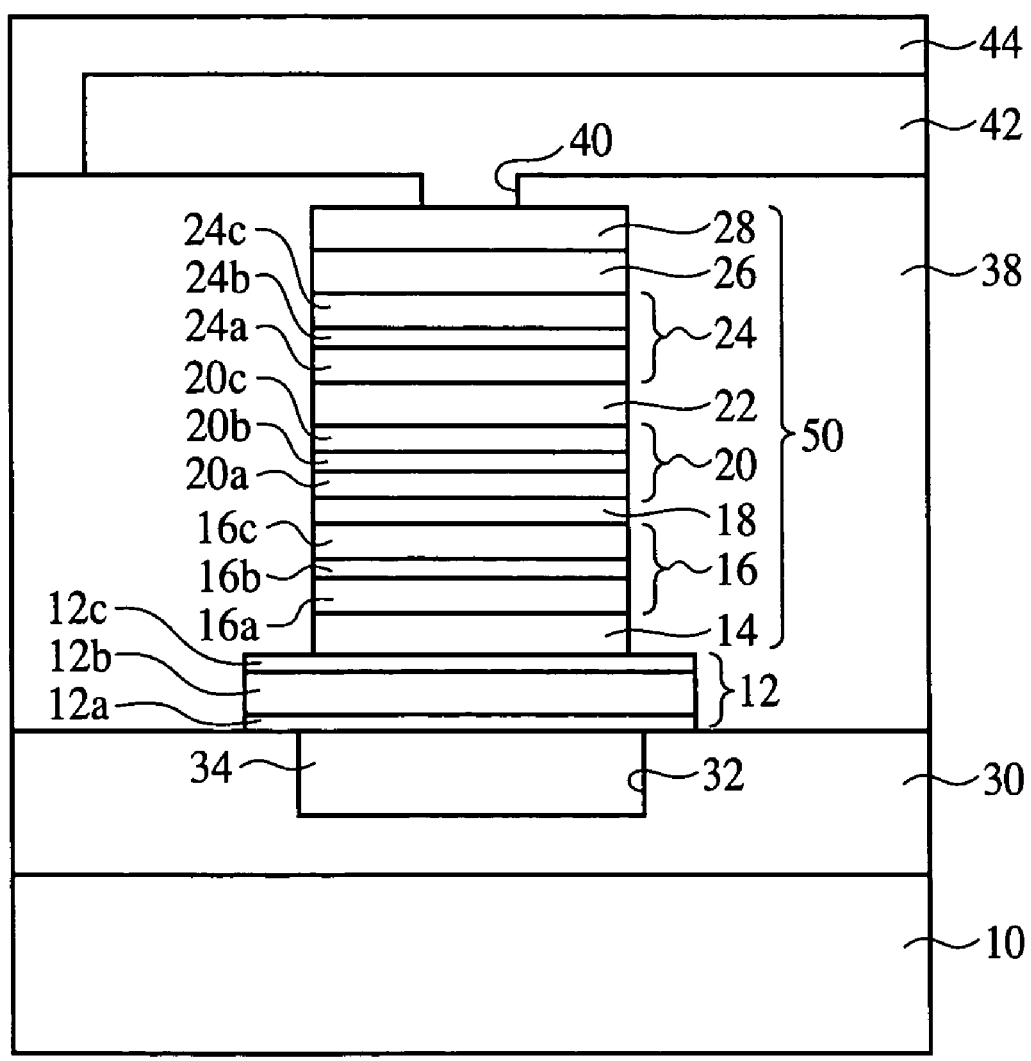
FIG. 10 is a diagrammatic sectional view showing a structure of the magnetoresistive effect element according to a second embodiment of the present invention.

The magnetoresistive effect element and the method for fabricating the same according to a second embodiment of the present invention will be explained with reference to FIGS. 10, 11A-11B and 12A-12B. FIG. 10 is a diagrammatic sectional view showing a structure of the magnetoresistive effect element according to the present embodiment. FIGS. 11A-11B and 12A-12B are sectional views of the magnetoresistive effect element according to the present embodiment in the steps of the method for fabricating the same, which show the method. The same members of the present embodiment as those of the magnetoresistive effect element and method for fabricating the same according to the first embodiment are represented by the same reference numbers not to repeat or to simplify their explanation.

First, the structure of the magnetoresistive effect element according to the present embodiment will be explained with reference to FIG. 10.

As shown, a lower electrode 12 is formed on an inter-layer insulating film 30 with an interconnection 34 buried in. The lower electrode 12 is formed of a Ta film 12a of, e.g., a 5 nm-thickness, a Cu film 12b of, e.g., a 50 nm-thickness and a Ta film 12c of, e.g., a 5 nm-thickness laid the latter on the former.

On the lower electrode 12, an antiferromagnetic layer 14 of a PtMn film of, e.g., a 15 nm-thickness is formed.

On the antiferromagnetic layer 14, a pinned magnetic layer 16 of the multilayered SAF structure is formed. The pinned magnetic layer 16 is formed of a ferromagnetic layer (a lower pinned magnetic layer) 16a of a CoFe film of, e.g., a 4 nm-thickness, a nonmagnetic layer 16b of a Ru film of, e.g., a 0.68 nm-thickness and a ferromagnetic layer (an upper pinned magnetic layer) 16c of a CoFeB layer of, e.g., a 4 nm-thickness laid the latter on the former.

On the pinned magnetic layer 16, a nonmagnetic spacer layer 18 is formed. The nonmagnetic spacer layer 18 is formed of a tunnel insulating film of a MgO film of, e.g., a 1.1 nm-thickness.

On the nonmagnetic spacer layer 18, a free magnetic layer 20 of the multilayered SAF structure is formed. The free magnetic layer 20 is formed of a ferromagnetic layer (a lower free magnetic layer) 20a of a CoFeB film of, e.g., a 2 nm-thickness, a nonmagnetic layer 20b of a Ru film of, e.g., a 0.8 nm-thickness and a ferromagnetic layer (an upper free magnetic layer) 20c of a CoFeB film of, e.g., a 2 nm-thickness laid the latter on the former. The free magnetic layer 20 includes two ferromagnetic layers.

On the free magnetic layer 20, a nonmagnetic spacer layer 22 is formed. The nonmagnetic spacer layer 22 is formed of a nonmagnetic conductor layer of a Cu film of, e.g., a 6 nm-thickness.

On the nonmagnetic spacer layer 22, a pinned magnetic layer 24 of the multilayered SAF structure is formed. The pinned magnetic layer 24 includes a ferromagnetic layer (a lower pinned magnetic layer) 24a of a CoFe film of, e.g., a 4 nm-thickness, a nonmagnetic layer 24b of a Ru film of, e.g., a 0.68 nm-thickness and a ferromagnetic layer (an upper pinned magnetic layer) 24c of a CoFe film of, e.g., a 4 nm-thickness laid the latter on the former.

On the pinned magnetic layer 24, an antiferromagnetic layer 26 of an IrMn film of, e.g., a 15 nm-thickness is formed.

On the antiferromagnetic layer 26, a cap layer 28 of a Ru film of, e.g., a 10 nm-thickness is formed.

Thus, the magnetoresistive effect element 50 according to the present embodiment including the antiferromagnetic layer 14, the pinned magnetic layer 16, the nonmagnetic spacer layer 18, the free magnetic layer 20, nonmagnetic spacer layer 22, the pinned magnetic layer 24, the antiferromagnetic layer 26 and the cap layer 28 laid the latter on the former is formed on the lower electrode 12. The magnetoresistive effect element 50 according to the present embodiment has the dual pin structure having the pinned magnetic layer 16 formed on the underside of the free magnetic layer 20 with the tunnel insulating film 18 formed therebetween, and the pinned magnetic layer 24 formed on the upper side of the free magnetic layer 20 with the nonmagnetic conductor layer 22 formed therebetween.

In the magnetoresistive effect element according to the present embodiment, the nonmagnetic spacer layer 18 is formed of the tunnel insulating film, and the nonmagnetic spacer layer 22 is formed of a nonmagnetic conductor layer. Accordingly, a resistance change of the magnetoresistive effect unit formed of the free magnetic layer 20/the nonmagnetic spacer layer 18/the pinned magnetic layer 16 is larger than a resistance change of the magnetoresistive effect unit formed of the pinned magnetic layer 24/the nonmagnetic spacer layer 22/the free magnetic layer 20.

For the free magnetic layer 20 of the multilayered SAF structure including two ferromagnetic layers, the pinned magnetic layers 16, 24 respectively have two ferromagnetic layers. Accordingly, the magnetization direction of the ferromagnetic layer 16c of the pinned magnetic layer 16, which is nearest the free magnetic layer 20, and the magnetization direction of the ferromagnetic layer 24a of the pinned magnetic layer 24, which is nearest the free magnetic layer 20, are the same.

On the inter-layer insulating film 30 with the magnetoresistive effect element 50 formed on, as in the first embodiment, an inter-layer insulating film 38, an interconnection 42 and an inter-layer insulating film 44 are formed.

One major characteristic of the magnetoresistive effect element 50 according to the present embodiment is that a resistance change of the magnetoresistive effect unit formed of the free magnetic layer 20/the nonmagnetic spacer layer 18/the pinned magnetic layer 16 is larger than a resistance change of the magnetoresistive effect unit formed of the pinned magnetic layer 24/the nonmagnetic spacer layer 22/the free magnetic layer 20.

Thus, the disadvantage that the resistance change of the magnetoresistive effect element 50 as a whole is not generated or much decreased is prevented, whereby the magnetoresistive effect element 50 as a whole can have large resistance change.

Another major characteristic of the magnetoresistive effect element 50 according to the present embodiment is that the magnetization direction of the ferromagnetic layer 16c of the pinned magnetic layer 16, which is nearest the free magnetic layer 20, and the magnetization direction of the ferromagnetic layer 24a of the pinned magnetic layer 24, which is nearest the free magnetic layer 20, are the same with respect to the free magnetic layer 20 of the multilayered SAF structure including two ferromagnetic layers.

The magnetization directions of the pinned magnetic layers 16, 24 are so set, whereby electrons having the opposite spin can be surely injected into the free magnetic layer 20 of the multilayered SAF structure including two ferromagnetic layers irrespective of a magnetization direction of the free magnetic layer 20 only by changing a direction of a current to be applied to the magnetoresistive effect element 50. Accordingly, the resistance change can be obtained independently of the magnetization reversing by the spin transfer of the reflected electrons, and the resistance-current hysteresis characteristic of good symmetry can be obtained.

In the magnetoresistive effect element 50 according to the present embodiment, as in the magnetoresistive effect element according to the first embodiment, the saturation magnetization and the thickness of the respective ferromagnetic layers forming the pinned magnetic layers 16, 24 of the multilayered SAF structure are suitably set to thereby sufficiently decrease the magnetic moments of the pinned magnetic layers 16, 24, whereby the magnetic coupling between the pinned magnetic layers 16, 24, and the free magnetic layer 20 can be suppressed. Accordingly, the shift of the resistance-current hysteresis characteristic can be sufficiently suppressed.

Next, the method for fabricating the magnetoresistive effect element according to the present embodiment will be explained with reference to FIGS. 11A-11B and 12A-12B.

Figure 11A:
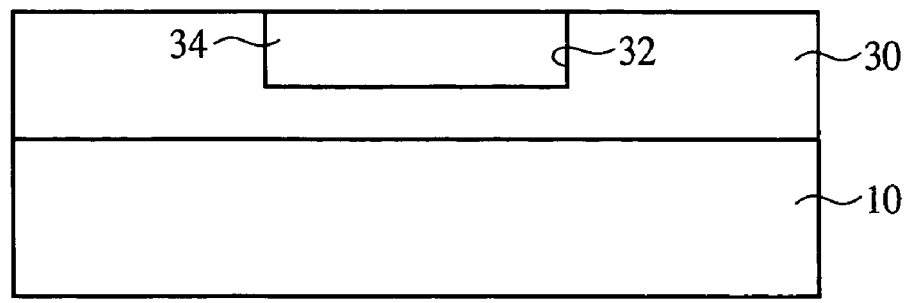
FIGS. 11A-11B and 12A-12B are sectional views of the magnetoresistive effect element according to the second embodiment of the present invention in the steps of the method for fabricating the same, which show the method.

First, in the same way as in the method for fabricating the magnetoresistive effect element according to the first embodiment shown in FIGS. 6A and 6B, the structure up to the interconnection 34 is formed on the silicon substrate 10 (FIG. 11A).

Next, on the inter-layer insulating film 30, the Ta film 12a of, e.g., a 5 nm-thickness, the Cu film 12b of, e.g., a 50 nm-thickness and the Ta film 12c of, e.g., a 5 nm-thickness are deposited to form the lower electrode 12 of layered films of the Ta film 12a, the Cu film 12b and the Ta film 12c.

Next, on the lower electrode 12, the PtMn film of, e.g., a 15 nm-thickness is deposited by, e.g., sputtering to form the antiferromagnetic layer 14 of the PtMn film.

Next, the ferromagnetic layer 16a of a CoFe film of, e.g., a 4 nm-thickness, the nonmagnetic layer 16b of a Ru film of, e.g., a 0.68 nm-thickness and the ferromagnetic layer 16c of a CoFeB film of, e.g., a 4 nm-thickness are laid the latter on the former by, e.g., sputtering to form the pinned magnetic layer 16 of the multilayered SAF structure.

Next, on the pinned magnetic layer 16, a MgO film of, e.g., a 1.1 nm-thickness is deposited by, e.g., sputtering to form the nonmagnetic spacer layer 18 of the MgO film.

Next, on the nonmagnetic spacer layer 18, the ferromagnetic layer 20a of a CoFeB film of, e.g., a 2 nm-thickness, the nonmagnetic layer 20b of a Ru film of, e.g., a 0.8 nm-thickness and the ferromagnetic layer 20c of a CoFeB film of, e.g., a 2 nm-thickness are laid the latter on the former by, e.g. sputtering. Thus, the free magnetic layer 20 of the multilayered SAF structure is formed.

Next, on the free magnetic layer 20, a Cu film of, e.g., a 6 nm-thickness is deposited by, e.g., sputtering to form the nonmagnetic spacer layer 22 of the Cu film.

Next, on the nonmagnetic spacer layer 22, the ferromagnetic layer 24a of a CoFe film of, e.g., a 4 nm-thickness, the nonmagnetic layer 24b of a Ru film of, e.g., a 0.68 nm-thickness and the ferromagnetic layer 24c of a CoFe film of, e.g., a 4 nm-thickness are laid the latter on the former by, e.g. sputtering. Thus, the pinned magnetic layer 24 of the multilayered SAF structure is formed.

Next, on the pinned magnetic layer 24, an IrMn film of, e.g., a 15 nm-thickness is deposited by, e.g., sputtering to form the antiferromagnetic layer 26 of the IrMn film.

Figure 11B:
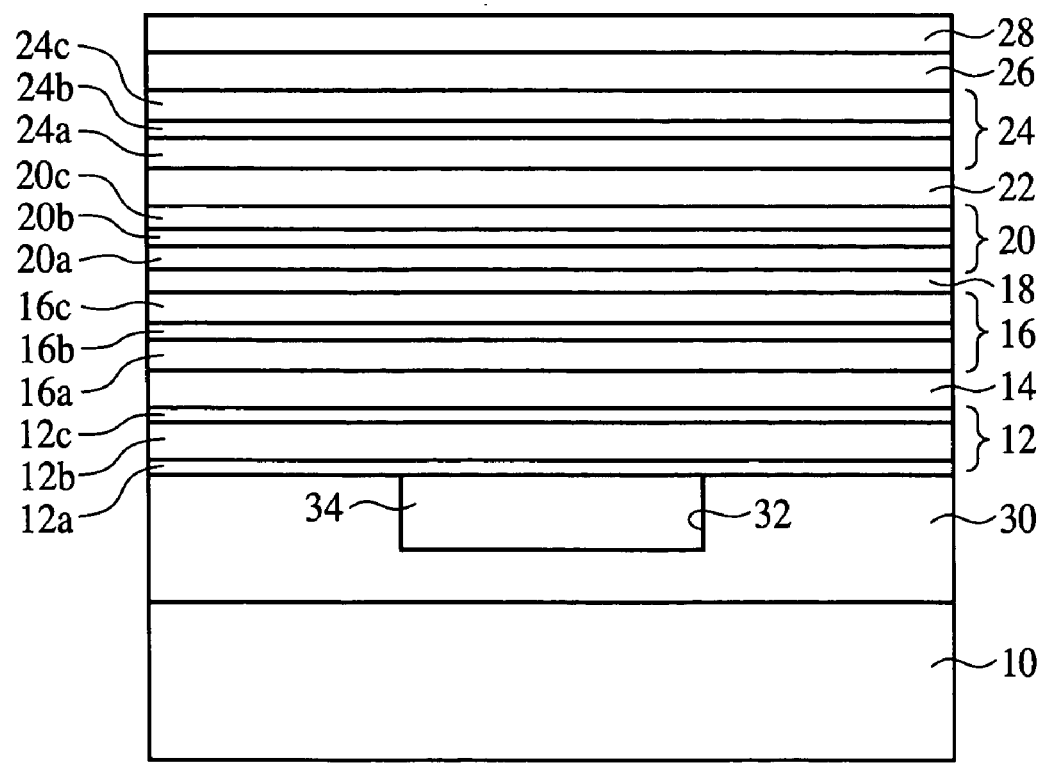

Then, on the antiferromagnetic layer 26, a Ru film of, e.g., a 10 nm-thickness is deposited by, e.g., sputtering to form the cap layer 28 of the Ru film (FIG. 11B).

Next, a photoresist film 46 having the pattern of the magnetoresistive effect element 50 is formed on the cap layer 28 by photolithography.

Figure 12A:
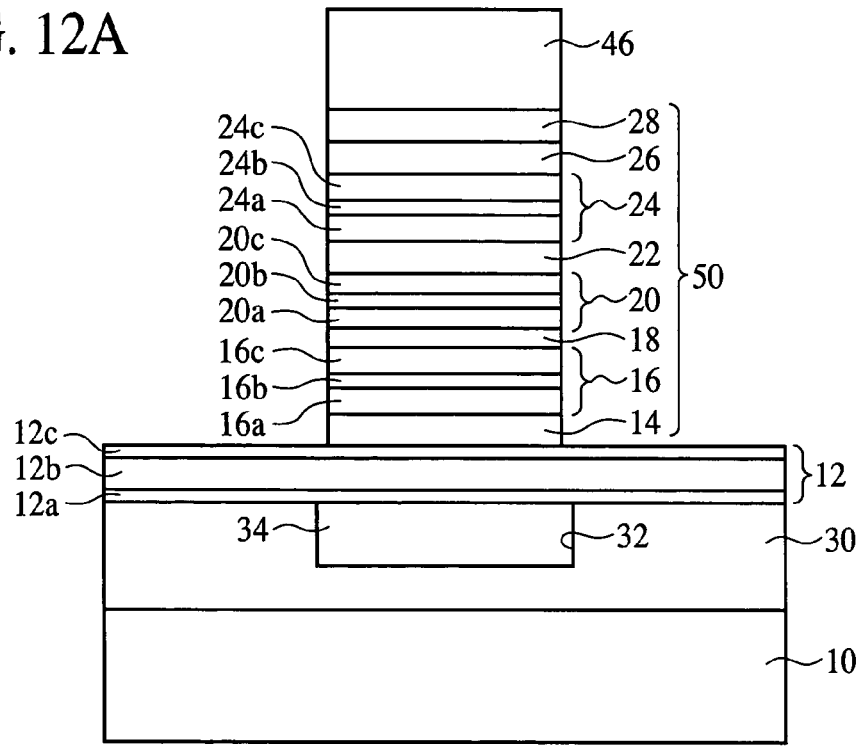

Then, with the photoresist film 46 as the mask, the cap layer 28, the antiferromagnetic layer 26, the pinned magnetic layer 24, the nonmagnetic spacer layer 22, the free magnetic layer 20 and the nonmagnetic spacer layer 18, the pinned magnetic layer 16 and the antiferromagnetic layer 14 are anisotropically etched. Thus, the magnetoresistive effect element 50 is formed (FIG. 12A).

Next, the photoresist film 46 is removed by, e.g., ashing.

Next, a photoresist film 48 for covering the magnetoresistive effect element 36 is formed by photolithography.

Figure 12B:
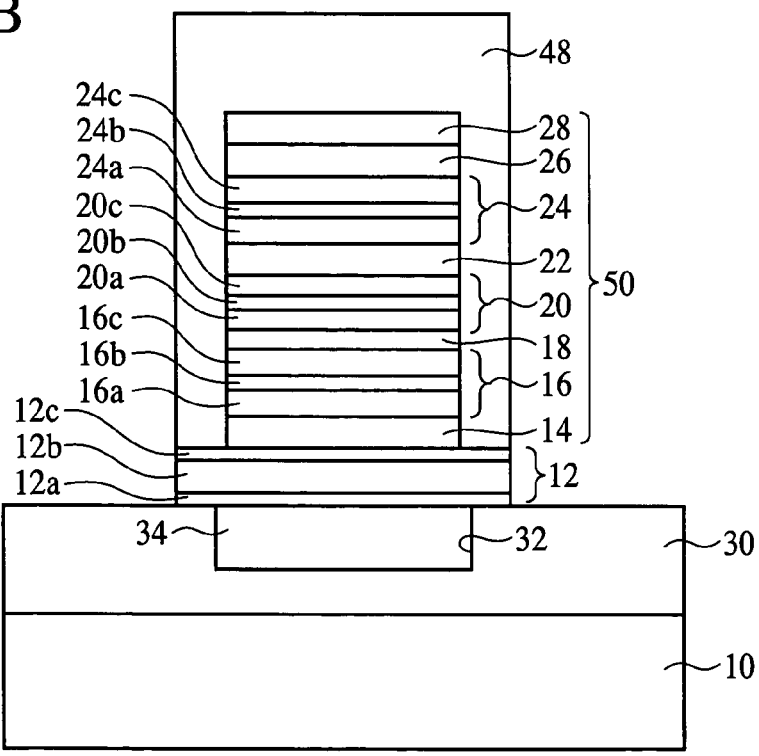

Next, with the photoresist film 48 as the mask, the lower electrode 12 is anisotropically etched by dry etching to pattern the lower electrode into the prescribed pattern (FIG. 12B).

Hereafter, in the same way as in the method for fabricating the magnetoresistive effect element according to the first embodiment shown in FIGS. 8B to 9B, the inter-layer insulating film 38, the interconnection 42, the inter-layer insulating film 44, etc. are formed.

As described above, according to the present embodiment, in the dual pin structure including the pinned magnetic layers 16, 24 formed respectively on the underside and the upper side of the free magnetic layer 20, a resistance change of the magnetoresistive effect unit formed of the free magnetic layer 20/the nonmagnetic spacer layer 18/the pinned magnetic layer 16 is larger than a resistance change of the magnetoresistive effect unit formed of the pinned magnetic layer 24/the nonmagnetic spacer layer 22/the free magnetic layer 20, whereby the disadvantage that the resistance change of the magnetoresistive effect element 50 as a whole is not generated or much decreased is prevented, and the magnetoresistive effect element 50 as a whole can have large resistance change.

According to the present embodiment, the magnetization direction of the ferromagnetic layer 16c of the pinned magnetic layer 16, which is nearest the free magnetic layer 20, and the magnetization direction of the ferromagnetic layer 24a of the pinned magnetic layer 24, which is nearest the free magnetic layer 20, are the same with respect to the free magnetic layer 20 of the multilayered SAF structure including two ferromagnetic layers, whereby the resistance change can be obtained independently of the magnetization reversing by the spin transfer of the reflected electrons, and the resistance-current hysteresis characteristic of good symmetry can be obtained.

According to the present embodiment, the saturation magnetization and the thickness of the respective ferromagnetic layers forming the pinned magnetic layers 16, 24 having the multilayered SAF structure are suitably set to thereby decrease the magnetic moments of the pinned magnetic layers 16, 24, whereby the magnetic coupling between the pinned magnetic layers 16, 24, and the free magnetic layer 20 can be suppressed. Accordingly, the shift of the resistance-current hysteresis characteristic can be sufficiently suppressed.

A Third Embodiment

Figure 13:
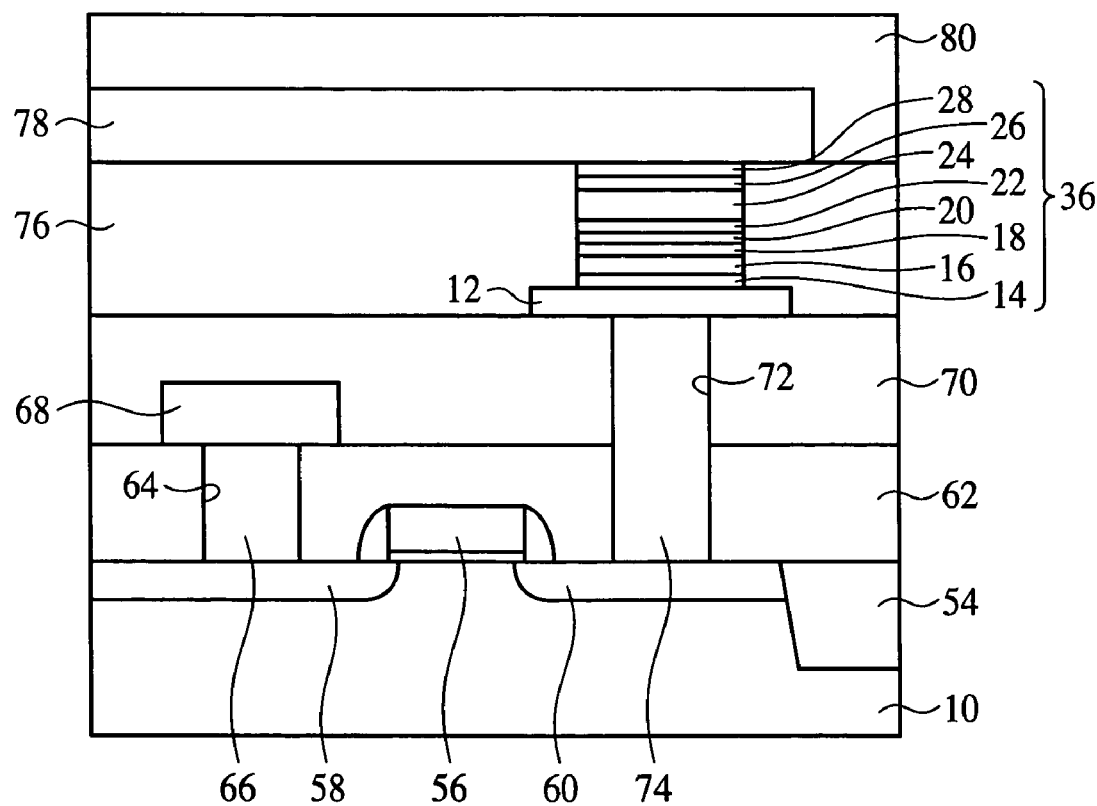
FIG. 13 is a diagrammatic sectional view showing a structure of the magnetic memory device according to a third embodiment of the present invention.

The magnetic memory device and the method for fabricating the same according to a third embodiment of the present invention will be explained with reference to FIGS. 13, 14A-14C, 15A-15B and 16A-16B. FIG. 13 is a diagrammatic sectional view showing a structure of the magnetic memory device according to the present embodiment. FIGS. 14A-14C, 15A-15B and 16A-16B are sectional views of the magnetic memory device according to the present embodiment in the steps of the method for fabricating the same, which show the method. The same members of the present embodiment as those of the magnetoresistive effect element and the method for fabricating the same according to the first embodiment are represented by the same reference numbers not to repeat or to simplify their explanation.

First, the structure of the magnetic memory device according to the present embodiment will be explained with reference to FIG. 13. The magnetic memory device according to the present embodiment is an active matrix magnetic memory device using the magnetoresistive effect elements 36 according to the first embodiment as the memory elements.

A device isolation film 54 for defining active regions is formed on the surface of a silicon substrate 10.

In an active region of the silicon substrate 10, which is defined by the device isolation film 54, a selective transistor including a gate electrode 56 and source/drain regions 58, 60 formed in the silicon substrate 10 on both sides of the gate electrode 56 is formed.

An inter-layer insulating film 62 is formed on the silicon substrate 10 with the selective transistor formed on. A contact hole 64 is formed in the inter-layer insulating film 62 down to the source/drain region 58. A contact plug 66 is buried in the contact hole 64, connected to the source/drain region 58. A ground line 68 electrically connected to the source/drain region 58 via the contact plug 66 is formed on the inter-layer insulating film 62.

On the inter-layer insulating film 62 with the ground line 68 formed on, an inter-layer insulating film 70 is formed. In the inter-layer insulating films 62, 70, a contact hole 72 is formed down to the source/drain region 60. In the contact hole 72, a contact plug 74 is buried, connected to the source/drain region 60. On the inter-layer insulating film 70, a lower electrode 12 is formed, electrically connected to the source/drain region 60 via the contact plug 74.

On the lower electrode 12, the magnetoresistive effect element 36 according to the first embodiment including the antiferromagnetic layer 14, the pinned magnetic layer 16, the nonmagnetic spacer layer 18, the free magnetic layer 20, the nonmagnetic spacer layer 22, the pinned magnetic layer 24, the antiferromagnetic layer 26 and the cap layer 28 laid the latter on the former is formed. An inter-layer insulating film 76 is formed on the inter-layer insulating film 70 and the lower electrode 12 in the region other than the region where the magnetoresistive effect element 36 is formed. A bit line 78 is formed on the inter-layer insulating film 76 with the magnetoresistive effect element 36 buried in, electrically connected to the cap layer 28 of the magnetoresistive effect element 36. An inter-layer insulating film 80 is formed on the bit line 78.

The gate electrode 56 functions as a word line extended perpendicularly to the drawing. A plurality of the word lines and a plurality of the bit lines 78 are arranged in a matrix, forming the active matrix magnetic memory device.

As described above, the magnetoresistive effect element 36 according to the first embodiment is used as the memory element, whereby a large-capacity magnetic memory device of low electric power consumption and high reliability can be provided.

Next, the method for fabricating the magnetic memory device according to the present embodiment will be explained with reference to FIGS. 14A-14C, 15A-15B and 16A-16B.

First, the device isolation film 54 is formed on the silicon substrate by, e.g., STI (Shallow Trench Isolation) method.

Figure 14A:
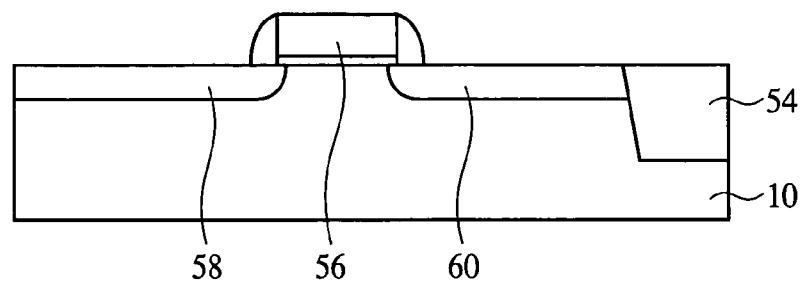
FIGS. 14A-14C, 15A-15B and 16A-16B are sectional views of the magnetic memory device according to the third embodiment of the present invention in the steps of the method for fabricating the same, which show the method.

Next, a selective transistor including the gate electrode 56 and the source/drain regions 58, 60 is formed in an active region defined by the device isolation film 54 in the same way as in the usual MOS transistor fabricating method (FIG. 14A).

Then, on the silicon substrate 10 with the selective transistor formed on, a silicon oxide film is deposited by, e.g., CVD method, and the surface of the silicon oxide film is planarized by CMP method to form the inter-layer insulating film 62 of the silicon oxide film.

Then, the contact hole 64 is formed in the inter-layer insulating film 62 down to the source/drain region 58 by photolithography and dry etching.

Next, a titanium nitride film as a barrier metal and a tungsten film are deposited by, e.g., CVD method, and then these conductive films are etched back or polished back to form the contact plug 66 buried in the contact hole 64 and electrically connected to the source/drain region 58.

Figure 14B:
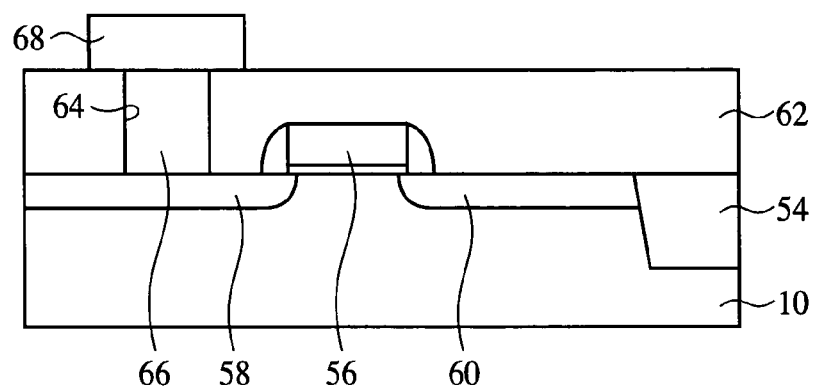

Next, on the inter-layer insulating film 62 with the contact plug 66 buried in, a conductive film is deposited and patterned to form the ground line 68 electrically connected to the source/drain region 58 via the contact plug 66 (FIG. 14B).

Next, a silicon oxide film is deposited by, e.g., CVD method on the inter-layer insulating film 62 with the ground line 68 formed on, and the surface of the silicon oxide film is planarized by CMP method to form the inter-layer insulating film 70 of the silicon oxide film.

Next, the contact hole 72 is formed in the inter-layer insulating films 62, 70 down to the source/drain region 60 by photolithography and dry etching.

Figure 14C:
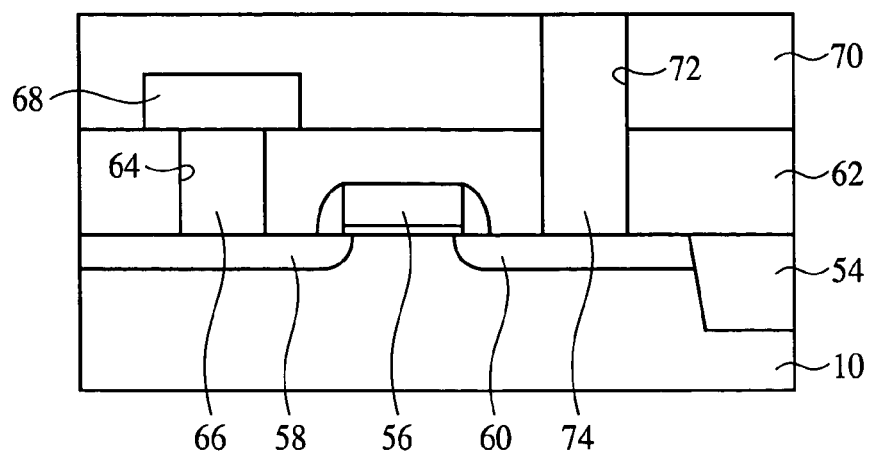

Then, a titanium nitride film as a barrier metal and a tungsten film are deposited by, e.g., CVD method, and then these conductive films are etched back or polished back to form the contact plug 74 buried in the contact hole 72 and electrically connected to the source/drain region 60 (FIG. 14C).

On the inter-layer insulating film 70 with the contact plug 72 buried in, a Cu film of, e.g., a 50 nm-thickness is deposited to form the lower electrode 12 of the Cu film.

Next, on the lower electrode 12, an IrMn film of, e.g., a 15 nm-thickness is deposited by, e.g., sputtering to form the antiferromagnetic layer 14 of the IrMn film.

Next, on the antiferromagnetic layer 14, a ferromagnetic layer of a CoFe film of, e.g., a 4 nm-thickness, a nonmagnetic layer of a Ru film of, e.g., a 0.8 nm-thickness and a ferromagnetic layer of a CoFe film of, e.g., a 4 nm-thickness are laid the latter on the former by, e.g., sputtering. Thus, the pinned magnetic layer 16 of the multilayered SAF structure is formed.

Next, on the pinned magnetic layer 16, a Cu film of, e.g., a 3 nm-thickness is deposited to form the nonmagnetic spacer 18 of the Cu film.

Next, on the nonmagnetic spacer layer 18, a CoFeB film of, e.g., a 2 nm-thickness is deposited by, e.g., sputtering to form the free magnetic layer 20 of the CoFeB film.

Next, on the free magnetic layer 20, a Cu film of, e.g., a 6 nm-thickness is deposited by, e.g., sputtering to form the nonmagnetic spacer layer 22 of the Cu film.

Next, on the nonmagnetic spacer 22, a ferromagnetic layer of a CoFe film of, e.g., a 4 nm-thickness, a nonmagnetic layer of a Ru film of, e.g. a 0.8 nm-thickness, a ferromagnetic layer of a CoFe film of, e.g., a 8 nm-thickness, a nonmagnetic layer of a Ru film of, e.g., a 0.8 nm-thickness and a ferromagnetic layer of a CoFe film of, e.g., a 4 nm-thickness are laid the latter on the former. Thus, the pinned magnetic layer 24 of the multilayered SAF structure is formed.

Next, on the pinned magnetic layer 24, an IrMn film of, e.g., a 15 nm-thickness is deposited by, e.g., sputtering to form the antiferromagnetic layer 26 of the IrMn film.

Next, on the antiferromagnetic layer 26, a Ru film of, e.g., a 10 nm-thickness is deposited by, e.g., sputtering to form the cap layer 28 of the Ru film.

Figure 15A:
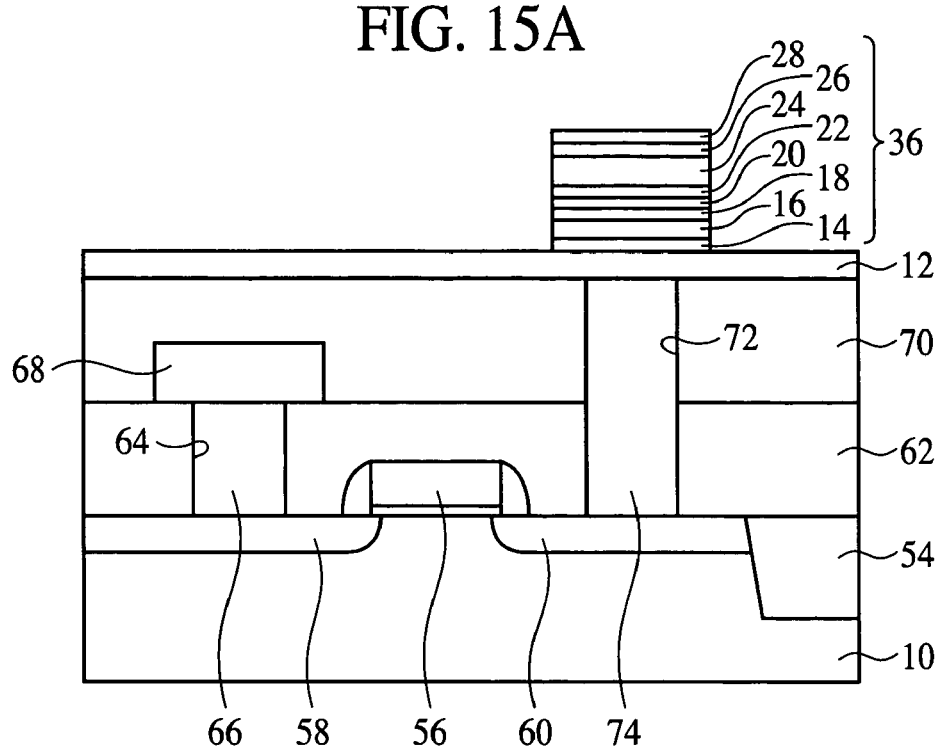

Then, the cap layer 28, the antiferromagnetic layer 26, the pinned magnetic layer 24, the nonmagnetic spacer layer 22, the free magnetic layer 20, the nonmagnetic spacer layer 18, the pinned magnetic layer 16 and the antiferromagnetic layer 14 are anisotropically etched. Thus, the magnetoresistive effect element 36 of, e.g., a 127 nm×260 nm size is fabricated (FIG. 15A).

Next, the lower electrode 12 is patterned into the prescribed configuration by photolithography and dry etching.

Figure 15B:
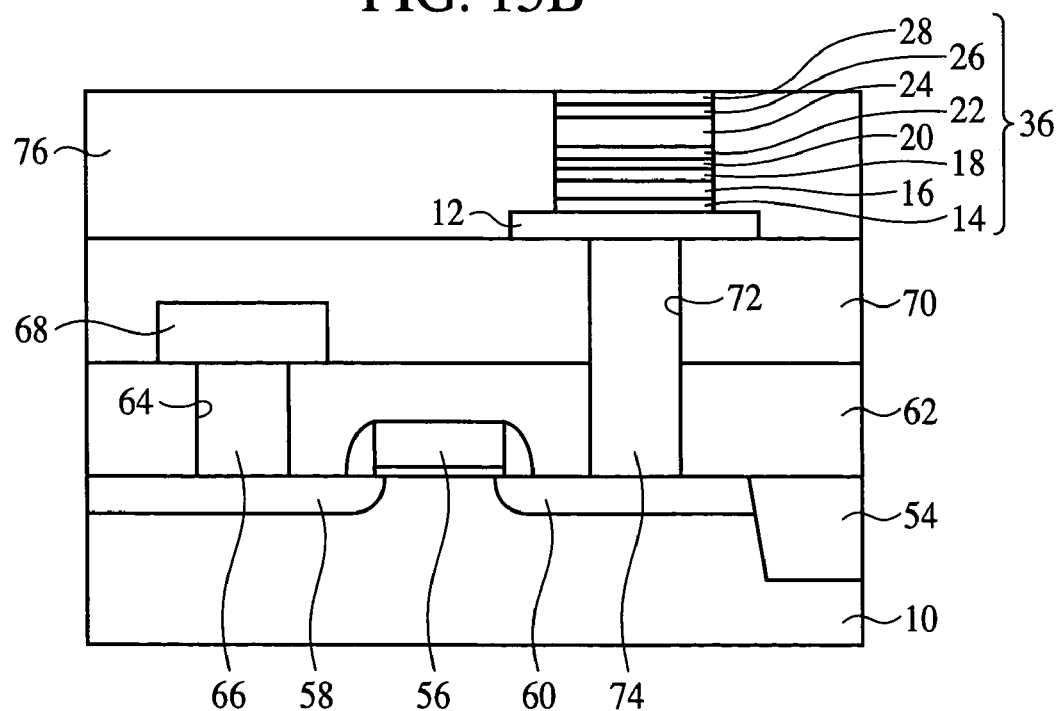

Next, on the inter-layer insulating film 70 with the magnetoresistive effect element 36 formed on, a silicon oxide film is deposited by, e.g., CVD method and then planarized by CMP method until the magnetoresistive effect element 36 is exposed, to thereby form the inter-layer insulating film 76 of the silicon oxide film having the surface planarized (FIG. 15B).

Figure 16A:
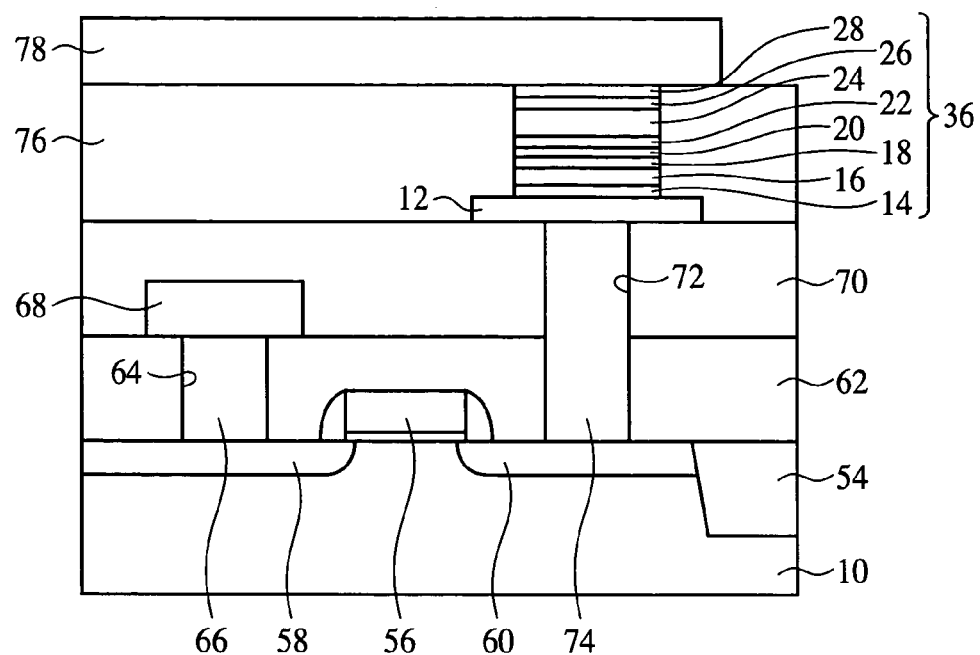

Next, on the inter-layer insulating film 36 with the magnetoresistive effect element 36 buried in, a conductive film is deposited and patterned to form the bit line 78 electrically connected to the cap layer 28 of the magnetoresistive effect element 36 (FIG. 16A).

Figure 16B:
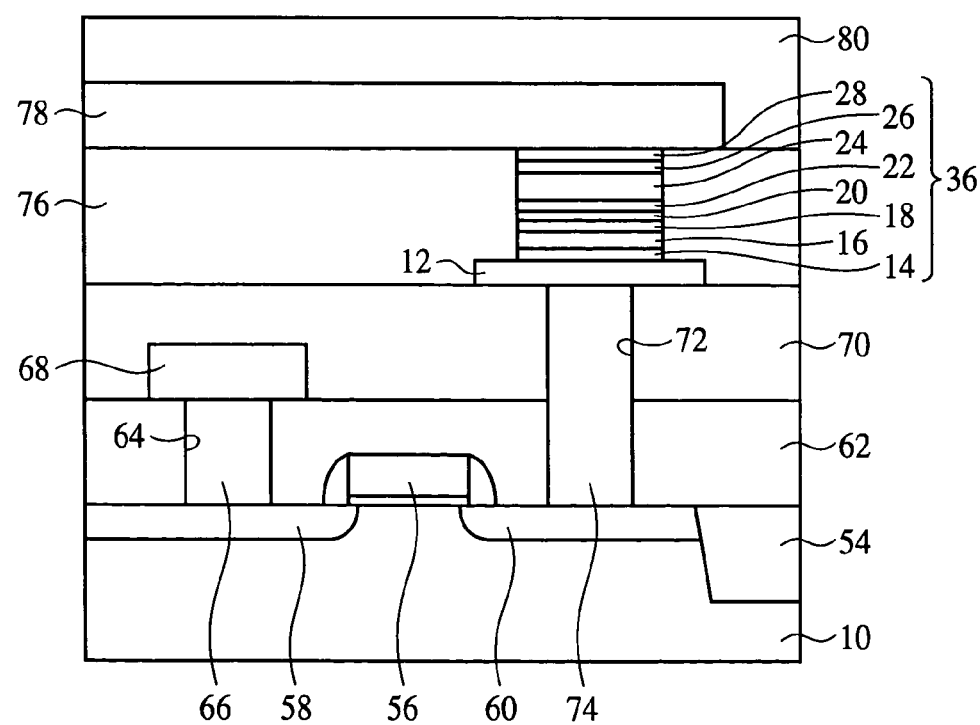

Next, a silicon oxide film, for example, is deposited on the entire surface by, e.g., CVD method to form the inter-layer insulating film 80 of the silicon oxide film (FIG. 16B).

Then, insulation films, interconnections, etc. are formed further thereon as required, and the magnetic memory device is completed.

In the present embodiment, the memory element of the magnetic memory device is the magnetoresistive effect element 36 according to the first embodiment, but the magnetoresistive effect element 50 according to the second embodiment may be used as the memory element.

Modified Embodiments

The present invention is not limited to the above-described embodiments and can cover other various modifications.

For example, in the above-described embodiments, the antiferromagnetic layers 14, 28 are formed of IrMn or PtMn. However, the antiferromagnetic layers 14, 28 may be formed of an antiferromagnetic material, such as PdPtMn or others in addition to IrMn and PtMn.

In the above-described embodiments, the ferromagnetic layers of the pinned magnetic layers 16, 24 and the ferromagnetic layer of the free magnetic layer 20 are formed of CoFe or CoFeB. However, these ferromagnetic layers may be formed of ferromagnetic materials, such as Co, Ni, Fe, NiFe, etc. in addition to CoFe and CoFeB. In the above-described embodiments, the nonmagnetic layers of the pinned magnetic layers 16, 24 and the nonmagnetic layer of the free magnetic layer 20 are formed of Ru. However, these nonmagnetic layers may be formed of a nonmagnetic material, such as Cu, Al, Au, etc. in addition to Ru.

In the first embodiment, the nonmagnetic spacer layers 18, 22 are both formed of nonmagnetic conductor layers, and in the second embodiment, the nonmagnetic spacer layers 18, 22 are formed respectively of the tunnel insulating film and the nonmagnetic conductor layer. However, the nonmagnetic spacer layers 18, 22 may be suitably formed of a nonmagnetic conductor layer or a tunnel insulating film.

When the nonmagnetic spacer layers 18, 22 are formed of nonmagnetic conductor layers, the nonmagnetic conductor layers can be formed of nonmagnetic materials, such as Ru, Al, Au, etc. in addition to Cu. When the nonmagnetic spacer layers 18, 22 are formed of tunnel insulating films, the tunnel insulating films can be formed of an insulating material, such as $AlO_x$, $HfO_x$, $TiO_x$, $TaO_x$, etc. in addition to MgO.

What is claimed is:

1. A magnetoresistive effect element comprising:
    a first pinned magnetic layer having a multilayered synthetic antiferromagnet (SAF) structure formed of a plurality of ferromagnetic layers stacked with a nonmagnetic layer formed therebetween;
    a first nonmagnetic spacer layer formed on the first pinned magnetic layer;
    a free magnetic layer formed on the first nonmagnetic spacer layer and including an odd number of ferromagnetic layers;
    a second nonmagnetic spacer layer formed on the free magnetic layer; and
    a second pinned magnetic layer formed on the second nonmagnetic spacer layer and having a multilayered SAF structure formed of a plurality of ferromagnetic layers stacked with a nonmagnetic layer formed therebetween,
    a magnetization direction of the ferromagnetic layer of the first pinned magnetic layer, which is nearest the free magnetic layer, and a magnetization direction of the ferromagnetic layer of the second pinned magnetic layer, which is nearest the free magnetic layer, being opposite to each other, wherein
    a magnetic moment of the first pinned magnetic layer is smaller than a value of 1/10 of a minimum value of respective magnetic moments of said plurality of ferromagnetic layers of the first pinned magnetic layer, and
    a magnetic moment of the second pinned magnetic layer is smaller than a value of 1/10 of the minimum value of respective magnetic moments of said plurality of ferromagnetic layers of the second pinned magnetic layer.

2. A magnetoresistive effect element according to claim 1, wherein
    a difference between a number of said plurality of ferromagnetic layers of the first pinned magnetic layer and a number of said plurality of ferromagnetic layers of the second pinned magnetic layer is one layer.

3. A magnetoresistive effect element according to claim 1, wherein
    the free magnetic layer has a multilayered synthetic antiferromagnet (SAF) structure formed of a plurality of said ferromagnetic layers stacked with a nonmagnetic layer formed therebetween.

4. A magnetoresistive effect element according to claim 1, wherein,
    a resistance change of a first magnetoresistive effect unit formed of the first pinned magnetic layer, the first nonmagnetic spacer layer and the free magnetic layer and a resistance change of a second magnetoresistive effect unit formed of the second pinned magnetic layer, the second nonmagnetic spacer layer and the free magnetic layer are different from each other.

5. A magnetoresistive effect element according to claim 4, wherein
    a resistance change of the first magnetoresistive effect unit and a resistance change of the second magnetoresistive effect unit are different from each other by above 10 times including 10 times.

6. A magnetic memory device comprising:
    a first interconnection;
    a second interconnection intersecting the first interconnection; and
    a magnetoresistive effect element according to claim 1, which is disposed in a region of an intersection between the first interconnection and the second interconnection.

7. A magnetoresistive effect element comprising:
    a first pinned magnetic layer having a multilayered synthetic antiferromagnet (SAF) structure formed of a plurality of ferromagnetic layers stacked with a nonmagnetic layer formed therebetween;
    a first nonmagnetic spacer layer formed on the first pinned magnetic layer;
    a free magnetic layer formed on the first nonmagnetic spacer layer and including an even number of ferromagnetic layers;
    a second nonmagnetic spacer layer formed on the free magnetic layer; and
    a second pinned magnetic layer formed on the second nonmagnetic spacer layer and having a multilayered SAF structure formed of a plurality of ferromagnetic layers stacked with a nonmagnetic layer formed therebetween,
    a magnetization direction of the ferromagnetic layer of the first pinned magnetic layer, which is nearest the free magnetization, and a magnetization direction of the ferromagnetic layer of the second pinned magnetic layer, which is nearest the free magnetic layer, being the same, wherein
    a magnetic moment of the first pinned magnetic layer is smaller than a value of 1/10 of a minimum value of respective magnetic moments of said plurality of ferromagnetic layers of the first pinned magnetic layer, and
    a magnetic moment of the second pinned magnetic layer is smaller than a value of 1/10 of the minimum value of respective magnetic moments of said plurality of ferromagnetic layers of the second pinned magnetic layer.

8. A magnetoresistive effect element according to claim 7, wherein
    a number of said plurality of ferromagnetic layers of the first pinned magnetic layer and a number of said plurality of ferromagnetic layers of the second pinned magnetic layer are the same even number.

9. A magnetoresistive effect element according to claim 7, wherein
    the free magnetic layer has a multilayered synthetic antiferromagnet (SAF) structure formed of a plurality of said ferromagnetic layers stacked with a nonmagnetic layer formed therebetween.

10. A magnetoresistive effect element according to claim 7, wherein,
    a resistance change of a first magnetoresistive effect unit formed of the first pinned magnetic layer, the first nonmagnetic spacer layer and the free magnetic layer and a resistance change of a second magnetoresistive effect unit formed of the second pinned magnetic layer, the second nonmagnetic spacer layer and the free magnetic layer are different from each other.

11. A magnetoresistive effect element according to claim 10, wherein
a resistance change of the first magnetoresistive effect unit and a resistance change of the second magnetoresistive effect unit are different from each other by above 10 times including 10 times.

12. A magnetic memory device comprising:
a first interconnection;
a second interconnection intersecting the first interconnection; and
a magnetoresistive effect element according to claim 7, which is disposed in a region of an intersection between the first interconnection and the second interconnection.

* * * * *